US012723192B2

(12) United States Patent
Izumida et al.

(10) Patent No.: US 12,723,192 B2

(45) Date of Patent: Sep. 1, 2026

(54) ORGANIC ELECTROLUMINESCENT ELEMENT

(71) Applicants: HODOGAYA CHEMICAL CO., LTD., Tokyo (JP); SFC CO., LTD., Chungcheongbuk-do (KR)

(72) Inventors: Junichi Izumida, Tokyo (JP); Takeshi Yamamoto, Tokyo (JP); Kouki Kase, Tokyo (JP); Kazuyuki Suruga, Tokyo (JP); Shuichi Hayashi, Tokyo (JP); Soon-Wook Cha, Cheongju-si (KR); Sung-Hoon Joo, Cheongju-si (KR); Byung-Sun Yang, Cheongju-si (KR); Ji-Hwan Kim, Cheongju-si (KR)

(73) Assignees: HODOGAYA CHEMICAL CO., LTD., Tokyo (JP); SFC CO., LTD., Chungcheongbuk-Do (KR)

( * ) Notice: Subject to any disclaimer, the term of this patent is extended or adjusted under 35 U.S.C. 154(b) by 1044 days.

(21) Appl. No.: 17/792,001

(22) PCT Filed: Jan. 21, 2021

(86) PCT No.: PCT/JP2021/002068

§ 371 (c)(1),
(2) Date: Jul. 11, 2022

(87) PCT Pub. No.: WO2021/149773

PCT Pub. Date: Jul. 29, 2021

(65) Prior Publication Data

US 2023/0101400 A1 Mar. 30, 2023

(30) Foreign Application Priority Data

Jan. 22, 2020 (JP) ................................ 2020-008577

(51) Int. Cl.

*C09K 11/06* (2006.01)
*H10K 50/11* (2023.01)

(Continued)

(52) U.S. Cl.

CPC ............. *C09K 11/06* (2013.01); *H10K 50/11* (2023.02); *H10K 50/156* (2023.02);

(Continued)

(58) Field of Classification Search

CPC .... H10K 50/11; H10K 85/658; H10K 85/631; H10K 50/156; H10K 50/15

See application file for complete search history.

(56) References Cited

U.S. PATENT DOCUMENTS 5,639,914 A 6/1997 Tomiyama et al.
5,707,747 A 1/1998 Tomiyama et al.

(Continued)

FOREIGN PATENT DOCUMENTS

CN 105378964 A 3/2016
CN 107112429 A 8/2017

(Continued)

OTHER PUBLICATIONS

Extended European Search Report issued in European Patent Application No. 21744719.2, Mar. 5, 2024.

(Continued)

*Primary Examiner* — Sean M DeGuire

(74) *Attorney, Agent, or Firm* — GREENBLUM & BERNSTEIN, P.L.C.

(57) ABSTRACT

An organic electroluminescent element including an anode and a cathode and including, between the anode and the cathode, at least a first hole transport layer, a second hole transport layer, a blue-light-emitting layer, and an electron transport layer disposed in this order from the anode side, in (Continued)

which at least one of the layers disposed between the first hole transport layer and the electron transport layer includes an arylamine compound represented by general formula (1).

(1)

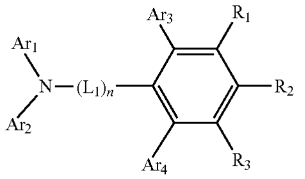

8 Claims, 15 Drawing Sheets

(51) Int. Cl.
*H10K 50/15* (2023.01)
*H10K 85/60* (2023.01)
(52) U.S. Cl.
CPC ......... *H10K 85/615* (2023.02); *H10K 85/631* (2023.02); *H10K 85/633* (2023.02); *H10K 85/6574* (2023.02); *H10K 85/658* (2023.02)

(56) References Cited

U.S. PATENT DOCUMENTS

| | | | | |
|---|---|---|---|---|
| 5,792,557 | A | 8/1998 | Nakaya et al. | |
| 2005/0221124 | A1 | 10/2005 | Hwang et al. | |
| 2006/0020136 | A1 | 1/2006 | Hwang et al. | |
| 2006/0115680 | A1 | 6/2006 | Hwang et al. | |
| 2007/0231503 | A1 | 10/2007 | Hwang et al. | |
| 2008/0076050 | A1 | 3/2008 | Abe et al. | |
| 2008/0107919 | A1 | 5/2008 | Hwang et al. | |
| 2008/0124572 | A1 | 5/2008 | Mizuki et al. | |
| 2010/0015542 | A1 | 1/2010 | Abe et al. | |
| 2012/0211733 | A1 | 8/2012 | Hwang et al. | |
| 2013/0187137 | A1 | 7/2013 | Mizuki et al. | |
| 2015/0221872 | A1 | 8/2015 | Hwang et al. | |
| 2016/0118591 | A1 | 4/2016 | Yokoyama et al. | |
| 2017/0005273 | A1 | 1/2017 | Hwang et al. | |
| 2018/0006235 | A1 | 1/2018 | Yokoyama et al. | |
| 2018/0159047 | A1 | 6/2018 | Hwang et al. | |
| 2018/0175301 | A1* | 6/2018 | Ookuma | C07C 211/54 |
| 2018/0331298 | A1 | 11/2018 | Hayashi et al. | |
| 2019/0006596 | A1 | 1/2019 | Hayashi et al. | |
| 2019/0157568 | A1 | 5/2019 | Hwang et al. | |
| 2019/0273216 | A1 | 9/2019 | Suruga et al. | |
| 2020/0152884 | A1 | 5/2020 | Hwang et al. | |
| 2020/0172558 | A1 | 6/2020 | Joo et al. | |
| 2021/0167293 | A1 | 6/2021 | Joo et al. | |
| 2021/0184121 | A1* | 6/2021 | Suh | C09K 11/06 |
| 2022/0251118 | A1* | 8/2022 | Kim | C07F 5/027 |

FOREIGN PATENT DOCUMENTS

| | | | |
|---|---|---|---|
| CN | 108352454 | A | 7/2018 |
| CN | 108475737 | A | 8/2018 |
| CN | 110088926 | A | 8/2019 |
| EP | 3 370 272 | A1 | 9/2018 |
| EP | 3 404 735 | A1 | 11/2018 |
| JP | H08-48656 | A | 2/1996 |
| JP | 3194657 | B2 | 7/2001 |
| JP | 2006-151979 | A | 6/2006 |
| JP | 4943840 | B2 | 5/2012 |
| JP | 5040216 | B2 | 10/2012 |
| JP | 2020-83896 | A | 6/2020 |
| WO | 2008/062636 | A1 | 5/2008 |
| WO | 2014/009310 | A1 | 1/2014 |
| WO | 2016/199743 | A1 | 12/2016 |
| WO | 2019-111844 | A1 | 6/2019 |
| WO | 2019/164331 | A1 | 8/2019 |

OTHER PUBLICATIONS

Office Action issued in TW Patent Application No. 110102473, Apr. 19, 2024, translation.
Office Action issued in CN Patent Application No. 202180010435.2, Mar. 27, 2025, translation.
Office Action issued in TW Patent Application No. 110102473, Jan. 16, 2024, translation.
Office Action issued in JP Patent Application No. 2021-572796, Jan. 30, 2024, translation.
Hosokawa, C. et al., Japan Society of Applied Physics Ninth Workshop Preprint, 2001, pp. 55-61.
Wakimoto, T., "Optimization of driving lifetime durability in organic LED devices using phosphorescent guest emitter", Japan Society of Applied Physics Ninth Workshop Preprint, 2001, pp. 23-31.
Endo, A. et al., "Efficient up-conversion of triplet excitons into a singlet state and its application for organic light emitting diodes", Applied Physics Letters, 98, 083302, 2011.
Organic EL Debate Third Regular Meeting Preprint, 2006, pp. 13-14.
International Search Report issued in International Patent Application No. PCT/JP2021/002068, dated Mar. 16, 2021, along with an English translation thereof.
Written Opinion of the International Searching Authority issued in International Application No. PCT/JP2021/002068, dated Mar. 16, 2021, along with an English translation thereof.
Office Action issued in KR Patent Application No. 10-2022-7024229, issued Jan. 23, 2025, translation.
Office Action issued in CN Patent Application No. 202180010435.2, Aug. 21, 2025, translation.
Office Action issued in CN Patent Application No. 202180010435.2, Jan. 8, 2026, translation.
Office Action issued in EP Patent Application No. 21744719.2, Jan. 29, 2026.
Office Action issued in CN Patent Application No. 202180010435.2, Jul. 15, 2026, translation.

* cited by examiner (1-1)

(1-2)

(1-3)

(1-4)

(1-5)

(1-6)

(1-7)

(1-8)

(1-9)

(1-10)

(1-11)

(1-12)

(1-13)

(1-14)

(1-15)

(1-16)

(1-17)

(1-18)

(1-19)

(1-20)

(1-21)

(1-22)

(1-23)

(1-24)

(1-25)

(1-26)

(1-27)

(1-28)

(1-29)

(1-30)

(1-31)

(1-32)

(1-33)

(1-34)

(1-35)

(1-36)

(1-37)

(1-38)

(1-39)

(1-40)

(1-41)

(1-42)

(1-43)

(1-44)

(1-45)

(1-46)

(1-47)

(1-48)

(1-49)

(1-50)

(1-51)

(1-52)

(1-53)

(1-54)

(1-55)

(1-56)

(1-57)

(1-58)

(1-59)

(1-60)

(1-61)

(1-62)

(1-63)

(1-64)

(1-65)

(1-66)

(1-67)

(1-68)

(1-69)

(1-70)

(1-71)

(1-72)

(1-73)

(1-74)

(1-75)

(1-76)

(1-77)

(1-78)

(1-79)

(1-80)

(1-81)

(1-82)

(1-83)

(1-84)

(1-85)

(1-86)

(1-87)

(1-88)

(1-89)

(1-90)

(1-91)

(1-92)

(1-93)

(1-94)

(1-95)

(1-96)

(1-97)

(1-98)

(1-99)

(1-100)

(1-101)

(1-102)

(1-103)

(1-104)

(1-105)

(1-106)

(1-107)

(1-108)

(1-109)

(1-110)

(1-111)

(1-112)

(1-113)

(1-114)

(1-115)

(1-116)

(1-117)

(1-118)

(1-119)

(1-120)

(1-121)

(1-122)

(1-123)

(1-124)

(1-125)

(1-126)

(1-127)

(1-128)

(1-129)

(1-130)

(1-131)

(1-132)

(1-133)

(1-134)

(1-135)

(1-136)

(1-137)

(1-138)

(1-139)

(1-140)

(1-141)

(1-142)

(1-143)

(1-144)

(1-145)

(1-146)

(1-147)

(1-148)

(1-149)

(1-150)

(1-151)

(1-152)

(1-153)

(1-154)

(1-155)

(1-156)

(1-157)

(1-158)

(1-159)

(1-160)

(1-161)

(1-162)

(1-163)

(1-164)

(1-165)

(1-166)

(1-167)

(1-168)

(1-169)

(1-170)

(1-171)

(1-172)

(1-173)

(1-174)

(1-175)

(1-176)

(1-177)

(1-178)

(2-1)

(2-2)

(2-3)

(2-4)

(2-5)

(2-6)

(2-7)

(2-8)

(2-9)

(2-10)

(2-11)

(2-12)

(2-13)

(2-14)

(2-15)

(2-16)

(2-17)

(2-18)

(2-19)

(2-20)

(2-21)

(2-22)

(2-23)

(2-24)

(3-1)

(3-2)

(3-3)

(3-4)

(3-5)

(3-6)

ORGANIC ELECTROLUMINESCENT ELEMENT

TECHNICAL FIELD

The present invention relates to an organic electroluminescent device which is a self-luminescent device suitable for various display devices, and more particularly, to an organic electroluminescent device (hereinafter, abbreviated as organic EL device) using a specific arylamine compound.

BACKGROUND ART

Since organic EL devices are self-luminescent devices, they are bright and excellent in visibility as compared with liquid-crystalline devices and capable of giving clear display. Therefore, the organic EL devices have been actively studied.

In 1987, C. W. Tang et al. of Eastman Kodak Company put an organic EL device using organic materials into practical use by developing a device having a laminated structure in which various roles are assigned to respective materials. They formed a lamination of a fluorescent material capable of transporting electrons and an organic material capable of transporting holes, so that both charges are injected into the layer of the fluorescent material to emit light, thereby achieving a high luminance of 1,000 cd/$m^2$ or more at a voltage of 10 V or lower (see, e.g., Patent Literatures 1 and 2).

To date, many improvements have been performed for practical utilization of the organic EL devices, and high efficiency and durability have been achieved by an electroluminescent device in which an anode, a hole injection layer, a hole transport layer, a light emitting layer, an electron transport layer, an electron injection layer, and a cathode are sequentially provided on a substrate, to further subdivide various roles of the laminated structure (see, e.g., Non-Patent Literature 1).

Moreover, for the purpose of further improvements of luminous efficiency, utilization of triplet exciton has been attempted and utilization of a phosphorescent compound has been investigated (see, e.g., Non-Patent Literature 2).

A device that utilizes light emission by thermally activated delayed fluorescence (TADF) has also been developed. In 2011, Adachi et al. of Kyushu University achieved external quantum efficiency of 5.3% through a device using a thermally activated delayed fluorescence material (see, e.g., Non-Patent Literature 3).

The light emitting layer can be also prepared by doping a charge-transporting compound, generally called a host material, with a fluorescent compound, a phosphorescent compound, or a material emitting delayed fluorescence. The choice of the organic materials in organic EL devices remarkably affects various characteristics such as efficiency and durability of the devices as described in the above-mentioned Non-Patent Literature (see, e.g., Non-Patent Literature 2).

In the organic EL devices, the charges injected from both electrodes are recombined in the light emitting layer to attain light emission. It is important to achieve efficient delivery of both charges of holes and electrons to the light emitting layer, and it is necessary to make the device excellent in carrier balance. In addition, when a hole-injection property is enhanced, and an electron-blocking property of blocking electrons injected from the cathode is enhanced, the probability of recombination of holes and electrons can be improved.

Furthermore, when excitons generated in the light emitting layer are confined, high luminous efficiency can be obtained. Therefore, the roles of the hole-transporting material are important, and there is a demand for a hole transport material which has high hole-injection property, high hole-mobility, a high electron-blocking property, and high durability for electrons.

The heat resistance and the amorphous property of the material are also important in terms of the device lifetime. A material having low heat resistance causes thermal decomposition even at a low temperature due to heat generated during driving of the device, and the material is deteriorated. A material having a low amorphous property causes crystallization of a thin film even in a short period, and the device is deteriorated. Therefore, the material used is required to have high heat resistance and good amorphous properties.

Known examples of the hole transport material used for the organic EL device, include N,N'-diphenyl-N,N'-di(α-naphthyl)benzidine (NPD) and various aromatic amine derivatives (see, e.g., Patent Literatures 1 and 2). Although NPD has a good hole-transporting ability, NPD has a glass transition point (Tg), which is an index of heat resistance, as low as 96° C., and thus causes a deterioration in device characteristics due to crystallization under high-temperature conditions (see, e.g., Non-Patent Literature 4). In addition, among the aromatic amine derivatives described in the above-mentioned Patent Literatures, a compound having excellent mobility such as a hole mobility of 10-3 $cm^2$/Vs or more has been known (see, e.g., Patent Literatures 1 and 2). However, this compound has an insufficient electron blocking property, so that a part of electrons pass through the light emitting layer, and improvements in the luminous efficiency cannot be expected. For higher efficiency, a material which has a higher electron-blocking property, forms a more stable thin film and has higher heat resistance has been required. An aromatic amine derivative having high durability has been reported (see, e.g., Patent Literature 3). However, this aromatic amine derivative has been used as a charge-transporting material used for an electrophotographic photoreceptor, and there has been no example using this aromatic amine derivative in an organic EL device.

As a compound with improved characteristics such as heat resistance and hole-injection property, arylamine compounds having a substituted carbazole structure have been proposed (see, e.g., Patent Literatures 4 and 5). However, in the case of a device in which these compounds are used for a hole injection layer or a hole transport layer, improvements in heat resistance, luminous efficiency, and the like have been achieved, but it is not yet sufficient, and further lower drive voltage and further higher luminous efficiency are required.

In order to improve the device characteristics of an organic EL device and to improve the yield of device fabrication, there is a demand for a device having high luminous efficiency, a low drive voltage, and long lifetime, in which holes and electrons can be recombined at high efficiency through combining materials that are excellent in an injection or transportation performance of holes and electrons, and excellent in stability and durability of a thin film.

In addition, in order to improve the device characteristics of the organic EL device, there is a demand for a device having high efficiency, low drive voltage, and long lifetime, in which a carrier balance is achieved by combining materials that are excellent in an injection or transportation performance of holes and electrons, and excellent in stability and durability of a thin film.

CITATION LIST

Patent Literature

Patent Literature 1: JP-A-H08-048656
Patent Literature 2: Japanese Patent No. 3194657
Patent Literature 3: Japanese Patent No. 4943840
Patent Literature 4: JP-A-2006-151979
Patent Literature 5: WO 2008/62636
Patent Literature 6: Japanese Patent No. 5040216
Patent Literature 7: WO 2014/009310

Non-Patent Literature

Non-Patent Literature 1: Japan Society of Applied Physics Ninth Workshop Preprint, pp. 55-61 (2001)
Non-Patent Literature 2: Japan Society of Applied Physics Ninth Workshop Preprint, pp. 23-31 (2001)
Non-Patent Literature 3: Appl. Phys. Let., 98, 083302 (2011)
Non-Patent Literature 4: Organic EL Debate Third Regular Meeting Preprint pp. 13-14 (2006)

SUMMARY OF INVENTION

Technical Problem

An object of the present invention is to provide, as a material for an organic EL device having high efficiency and high durability, a material for an organic EL device, which is excellent in an injection or transportation performance of holes, the electron blocking ability, and the stability and durability of the state of a thin film. Further, another object is to provide an organic EL device having high efficiency, a low drive voltage, and long lifetime by combining this material with various materials for an organic EL device, which are excellent in an injection or transportation performance of holes and electrons, the electron blocking ability, or the stability and durability of the state of a thin film so that characteristics of each material can be exhibited effectively.

Physical characteristics that an organic compound to be provided by the present invention should possess can include: (1) good hole injection characteristics; (2) large hole mobility; (3) a stable thin film state; and (4) excellent heat resistance. Physical characteristics that an organic EL device to be provided by the present invention should possess can include: (1) high luminous efficiency and power efficiency; (2) a low light-emission start voltage; (3) a low practical drive voltage; and (4) long lifetime.

Solution to Problem

In order to achieve the above-described objects, the present inventors focused on the fact that an arylamine compound having a specific structure is excellent in injection and transport abilities of holes, and stability and durability of a thin film. They selected various arylamine compounds to prepare organic EL devices, and evaluated the characteristics of the devices diligently. As a result, the present inventors have found that when an arylamine compound having a specific structure is selected as a material of the hole transport layer, the holes injected from the anode side can be efficiently transported. Further, they combined the arylamine compound with light emitting materials having a specific structure to prepare various organic EL devices, and evaluated the characteristics of the devices diligently. As a result, the present invention has been completed.

An organic EL device according to the present invention, which can solve the above problems, is an organic electroluminescence device including:

an anode and a cathode, and at least a first hole transport layer, a second hole transport layer, a blue light emitting layer, and an electron transport layer in this order from an anode side between the anode and the cathode, in which at least one layer of the layers disposed between the first hole transport layer and the electron transport layer contains an arylamine compound represented by the following general formula (1).

(1)

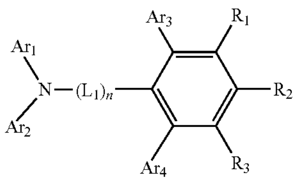

(In formula, $Ar_1$, $Ar_2$, $Ar_3$, and $Ar_4$ may be the same as or different from each other, and each represent a substituted or unsubstituted aromatic hydrocarbon group, a substituted or unsubstituted aromatic heterocyclic group, or a substituted or unsubstituted condensed polycyclic aromatic group, $L_1$ represents a divalent group of a substituted or unsubstituted aromatic hydrocarbon, a divalent group of a substituted or unsubstituted aromatic heterocycle, or a divalent group of a substituted or unsubstituted condensed polycyclic aromatic, $R_1$, $R_2$, and $R_3$ may be the same as or different from each other, and each represent a hydrogen atom, a deuterium atom, a fluorine atom, a chlorine atom, a cyano group, a nitro group, a linear or branched alkyl group having a carbon number of 1 to 6 which may have a substituent, a cycloalkyl group having a carbon number of 5 to 10 which may have a substituent, a linear or branched alkenyl group having a carbon number of 2 to 6 which may have a substituent, a linear or branched alkyloxy group having a carbon number of 1 to 6 which may have a substituent, a cycloalkyloxy group having a carbon number of 5 to 10 which may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy group, and n represents an integer of 1 to 3.)

Advantageous Effects of Invention

The arylamine compounds represented by the foregoing general formula (1), which are preferably used in the organic EL device according to the present invention, can be used as a constituent material of a hole transport layer of the organic EL device. The arylamine compounds represented by the foregoing general formula (1) has characteristics of (1) good hole injection characteristics, (2) high hole mobility, (3) excellent electron blocking ability, (4) a stable thin film state, and (5) excellent heat resistance.

Since arylamine compounds, which have hole mobility higher than that of a conventional hole transport material, have an excellent electron blocking ability, have an excellent amorphous property, and are stable in a thin film state, are used for the organic EL device according to the present invention, it is possible to achieve an organic EL device having high efficiency, a low drive voltage, and a long lifetime.

Further, in the present invention, in the case where the hole transport layer has a two-layer structure of the first hole transport layer and the second hole transport layer, and the second hole transport layer located on a side adjacent to the light emitting layer is formed of the arylamine compound represented by the foregoing general formula (1), the electron blocking performance of the arylamine compound can be fully utilized, and a more efficient and long lifetime organic EL device can be achieved.

DESCRIPTION OF EMBODIMENTS

Figure 1:
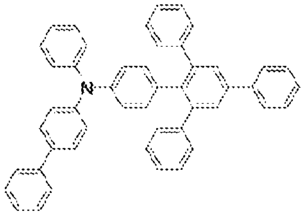
FIG. 1 is a diagram showing structural formulae of Compounds 1-1 to 1-15 as examples of the arylamine compound represented by general formula (1).
Figure 1:
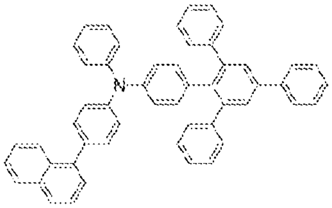
Figure 1:
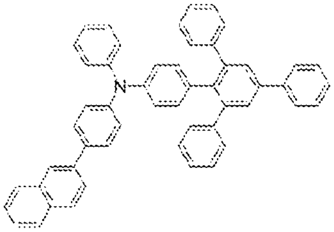
Figure 1:
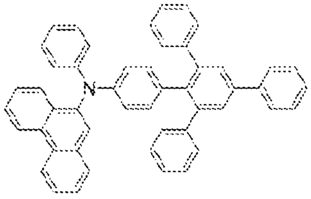
Figure 1:
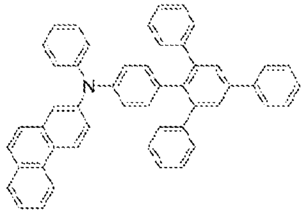
Figure 1:
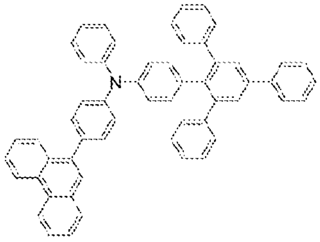
Figure 1:
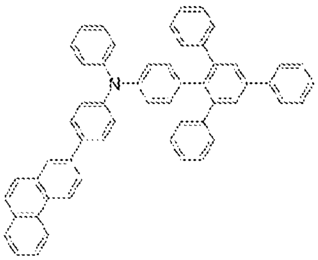
Figure 1:
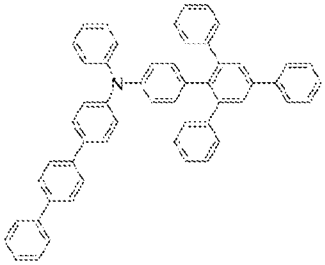
Figure 1:
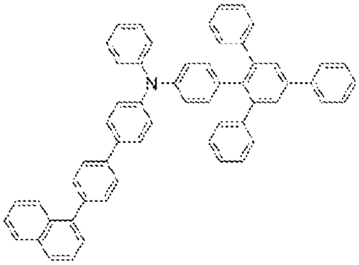
Figure 1:
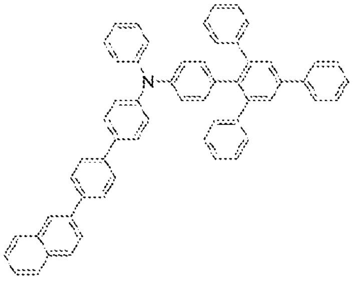
Figure 1:
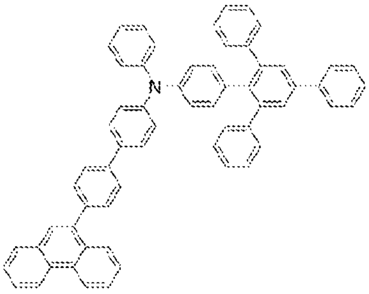
Figure 1:
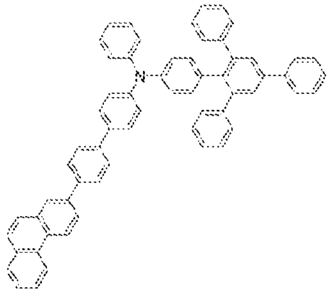
Figure 1:
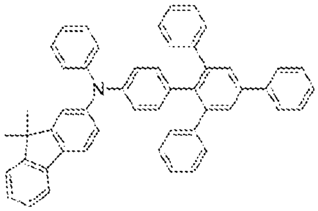
Figure 1:
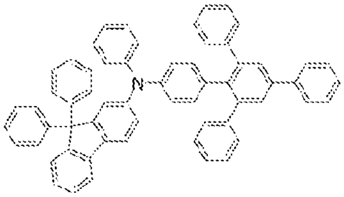
Figure 1:
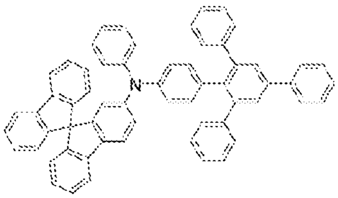
Figure 2:
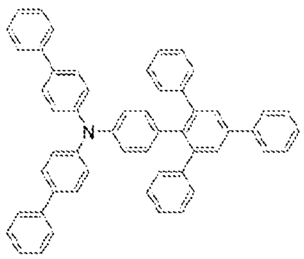
FIG. 2 is a diagram showing structural formulae of Compounds 1-16 to 1-30 as examples of the arylamine compound represented by the general formula (1).
Figure 2:
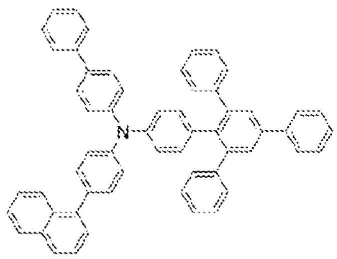
Figure 2:
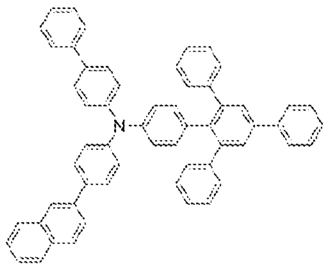
Figure 2:
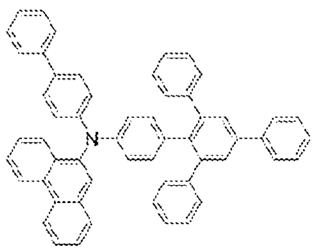
Figure 2:
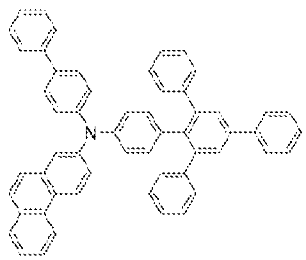
Figure 2:
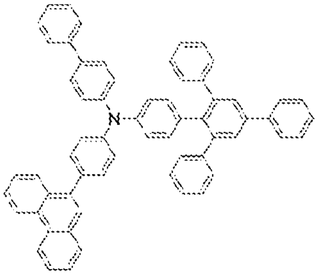
Figure 2:
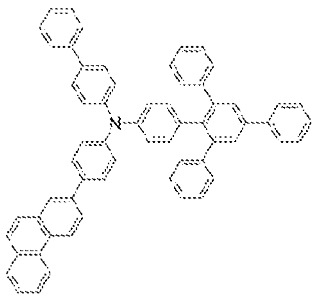
Figure 2:
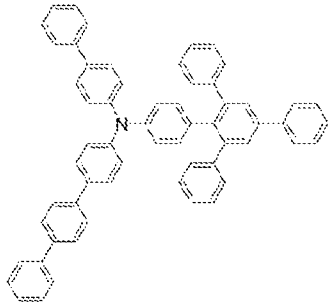
Figure 2:
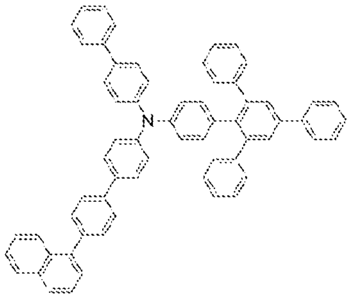
Figure 2:
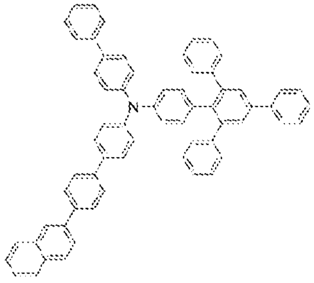
Figure 2:
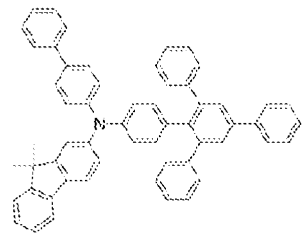
Figure 2:
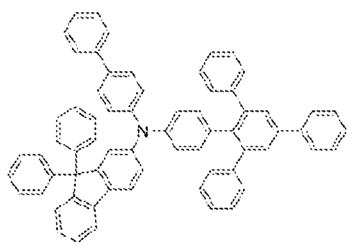
Figure 2:
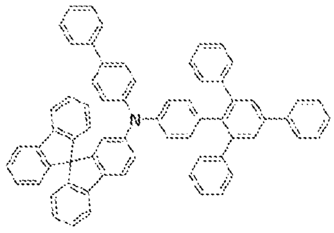
Figure 2:
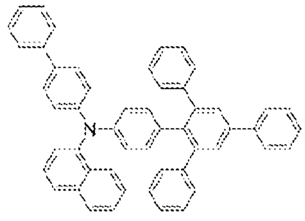
Figure 2:
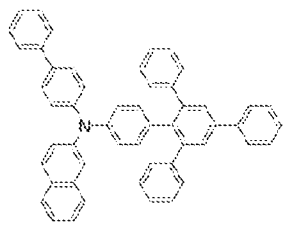
Figure 3:
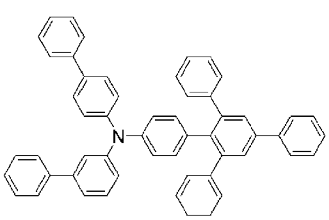
FIG. 3 is a diagram showing structural formulae of Compounds 1-31 to 1-45 as examples of the arylamine compound represented by the general formula (1).
Figure 3:
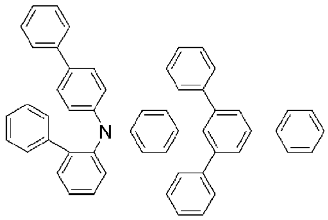
Figure 3:
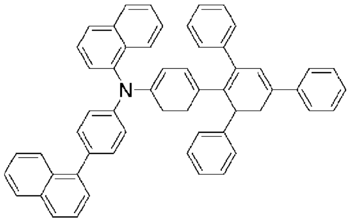
Figure 3:
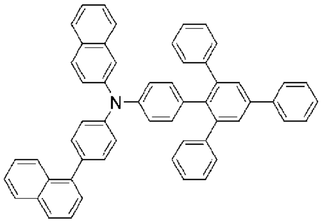
Figure 3:
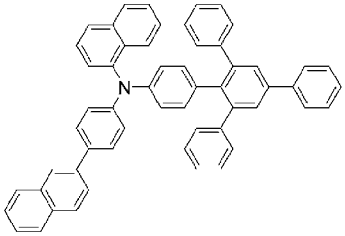
Figure 3:
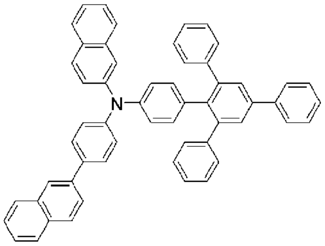
Figure 3:
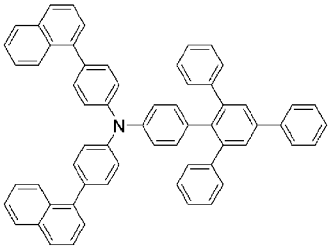
Figure 3:
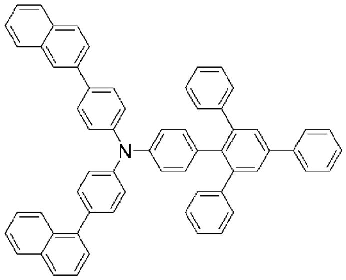
Figure 3:
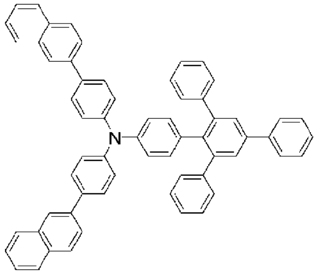
Figure 3:
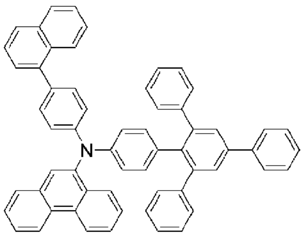
Figure 3:
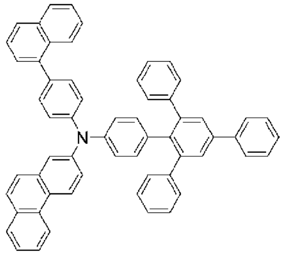
Figure 3:
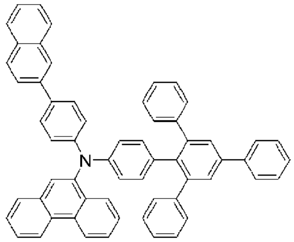
Figure 3:
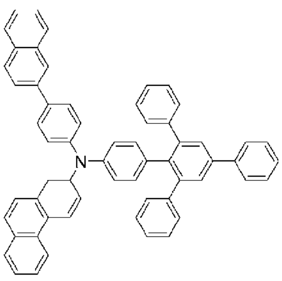
Figure 3:
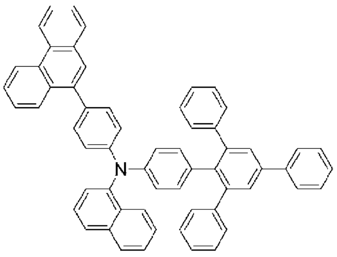
Figure 3:
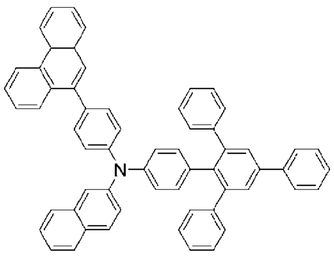
Figure 4:
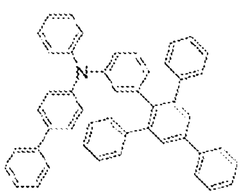
FIG. 4 is a diagram showing structural formulae of Compounds 1-46 to 1-60 as examples of the arylamine compound represented by the general formula (1).
Figure 4:
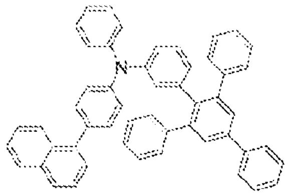
Figure 4:
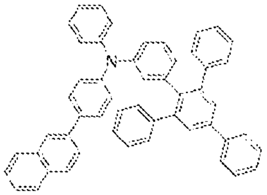
Figure 4:
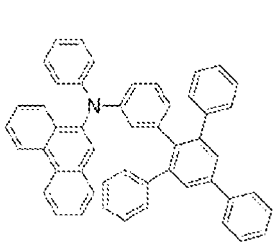
Figure 4:
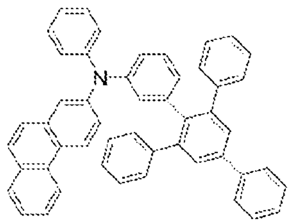
Figure 4:
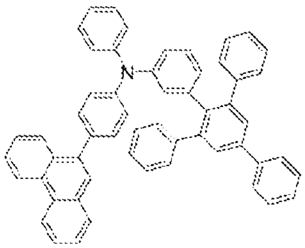
Figure 4:
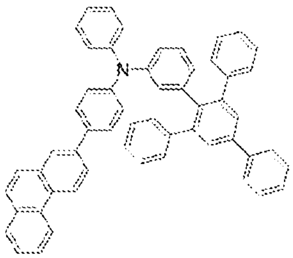
Figure 4:
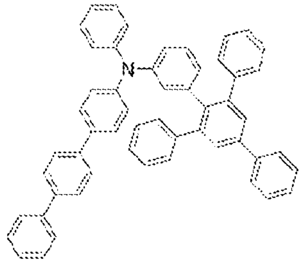
Figure 4:
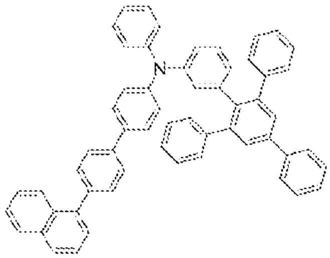
Figure 4:
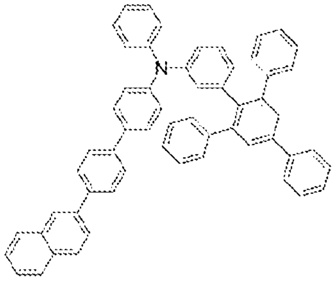
Figure 4:
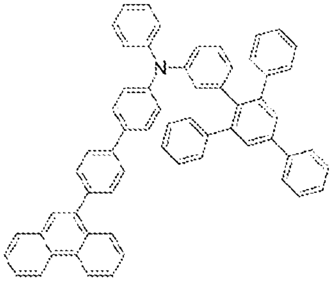
Figure 4:
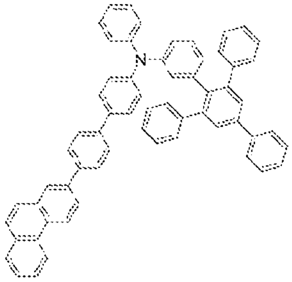
Figure 4:
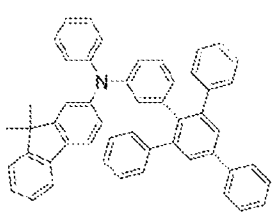
Figure 4:
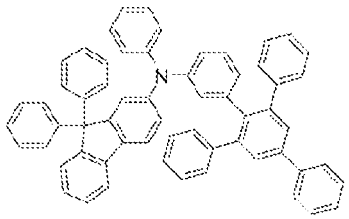
Figure 4:
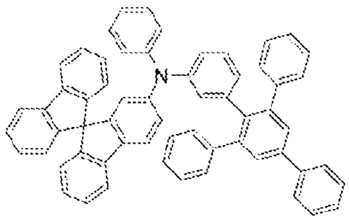
Figure 5:
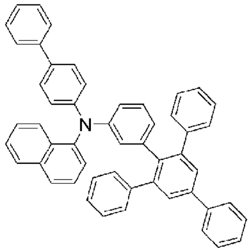
FIG. 5 is a diagram showing structural formulae of Compounds 1-61 to 1-75 as examples of the arylamine compound represented by the general formula (1).
Figure 5:
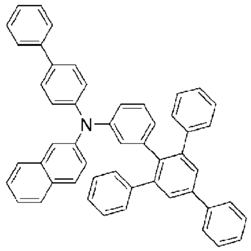
Figure 5:
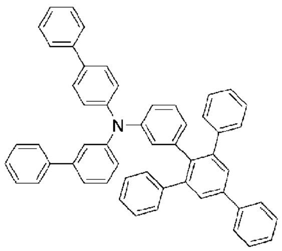
Figure 5:
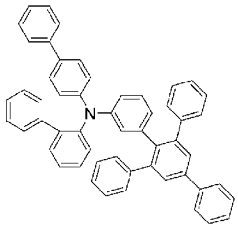
Figure 5:
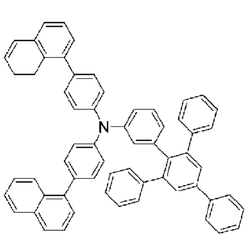
Figure 5:
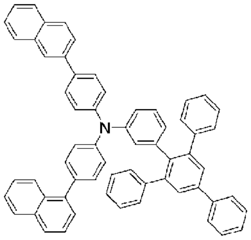
Figure 5:
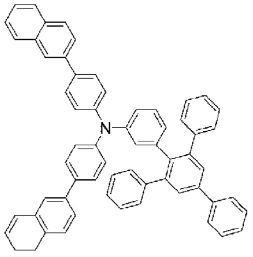
Figure 5:
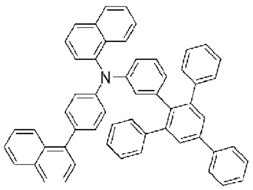
Figure 5:
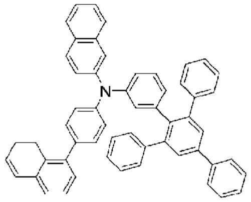
Figure 5:
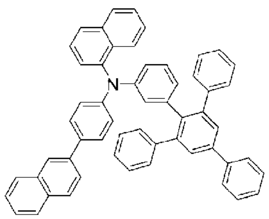
Figure 5:
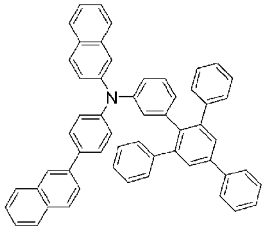
Figure 5:
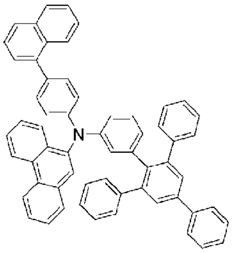
Figure 5:
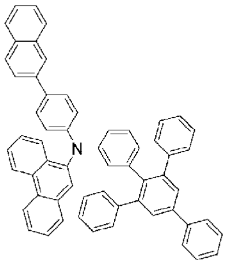
Figure 5:
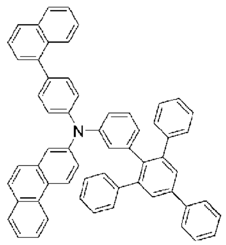
Figure 5:
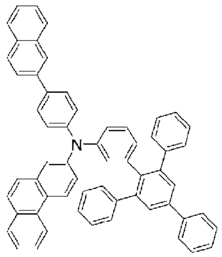
Figure 6:
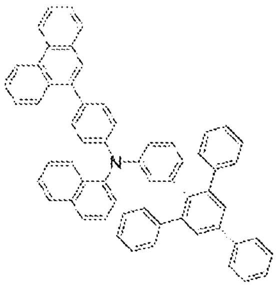
FIG. 6 is a diagram showing structural formulae of Compounds 1-76 to 1-90 as examples of the arylamine compound represented by the general formula (1).
Figure 6:
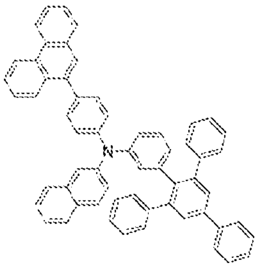
Figure 6:
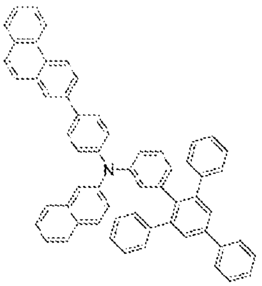
Figure 6:
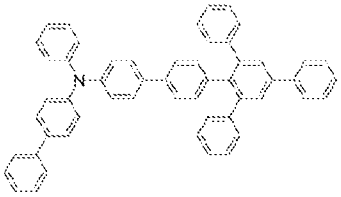
Figure 6:
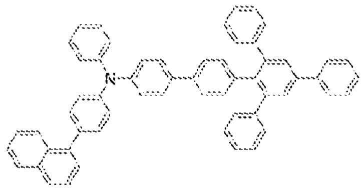
Figure 6:
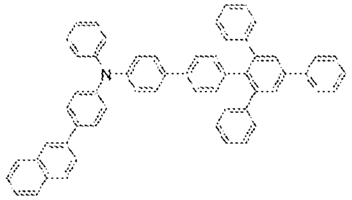
Figure 6:
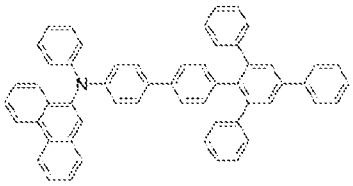
Figure 6:
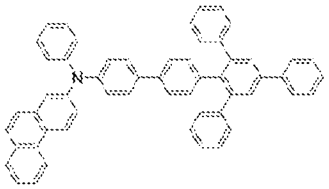
Figure 6:
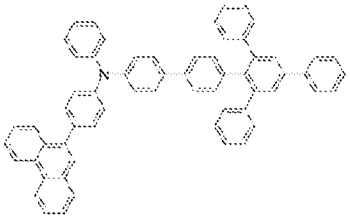
Figure 6:
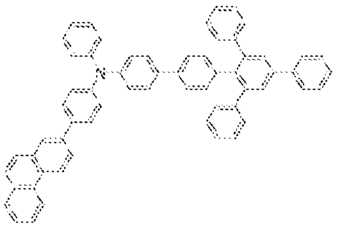
Figure 6:
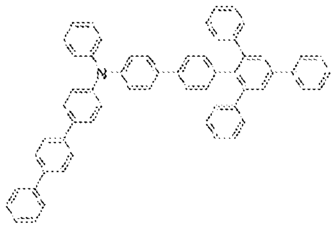
Figure 6:
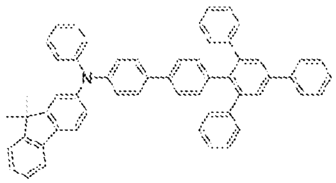
Figure 6:
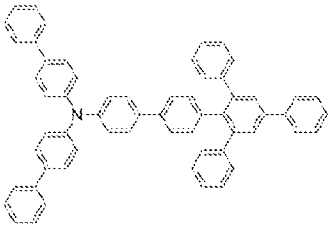
Figure 6:
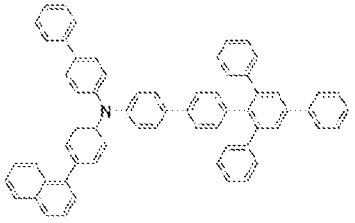
Figure 6:
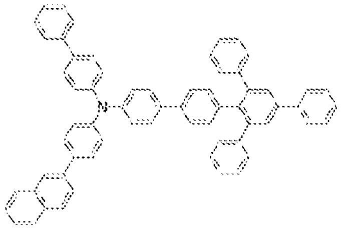
Figure 7:
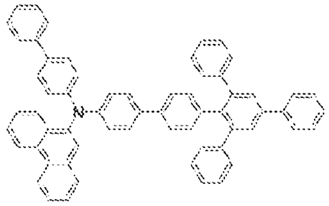
FIG. 7 is a diagram showing structural formulae of Compounds 1-91 to 1-105 as examples of the arylamine compound represented by the general formula (1).
Figure 7:
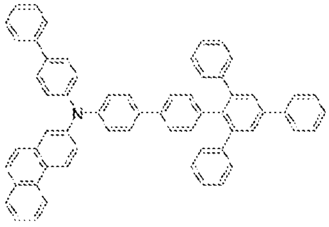
Figure 7:
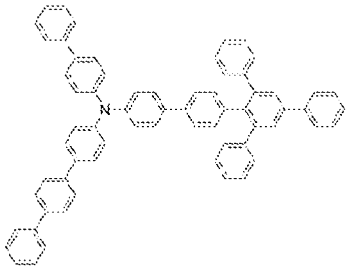
Figure 7:
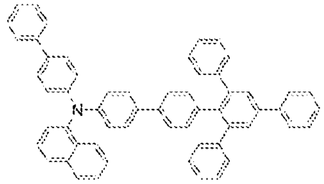
Figure 7:
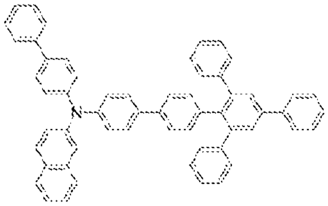
Figure 7:
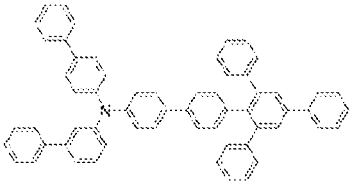
Figure 7:
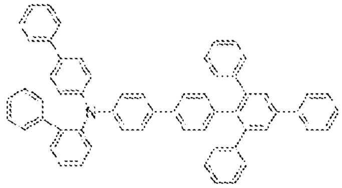
Figure 7:
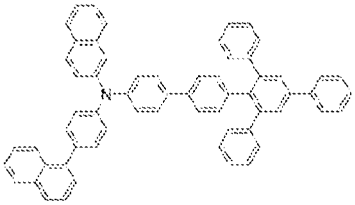
Figure 7:
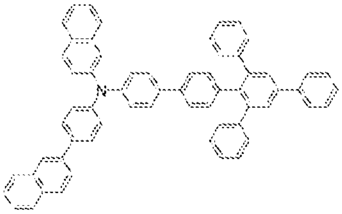
Figure 7:
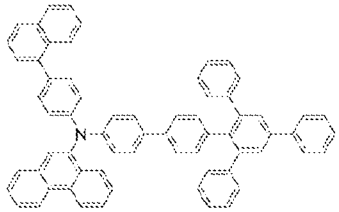
Figure 7:
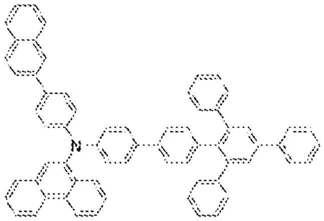
Figure 7:
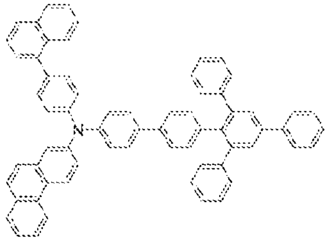
Figure 7:
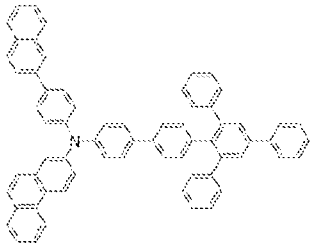
Figure 7:
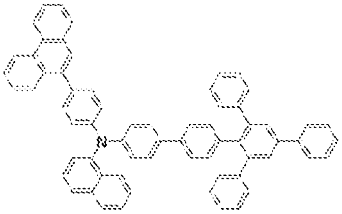
Figure 7:
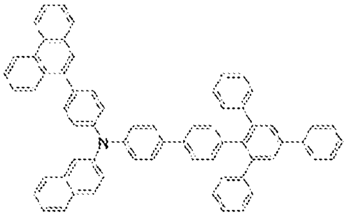
Figure 8:
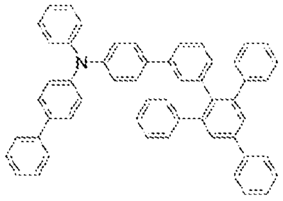
FIG. 8 is a diagram showing structural formulae of Compounds 1-106 to 1-120 as examples of the arylamine compound represented by the general formula (1).
Figure 8:
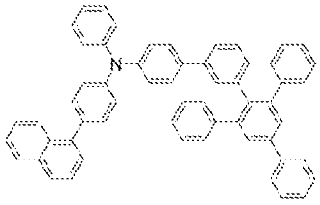
Figure 8:
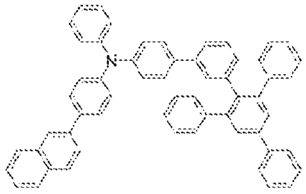
Figure 8:
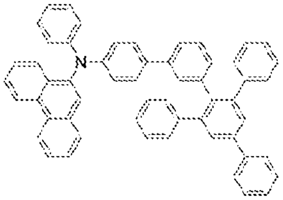
Figure 8:
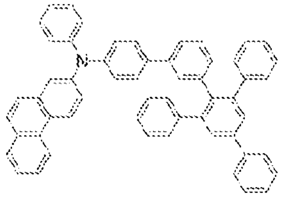
Figure 8:
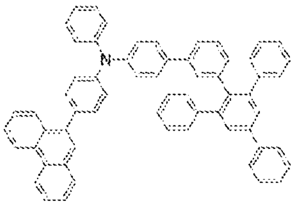
Figure 8:
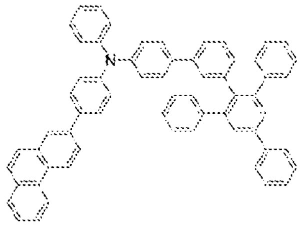
Figure 8:
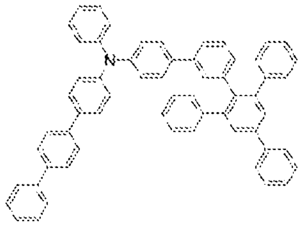
Figure 8:
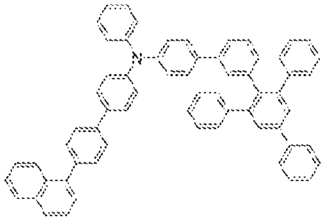
Figure 8:
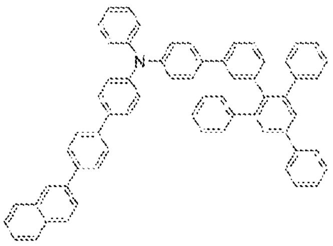
Figure 8:
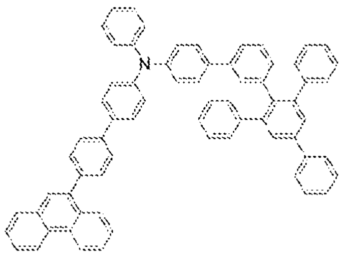
Figure 8:
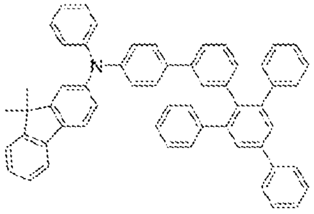
Figure 8:
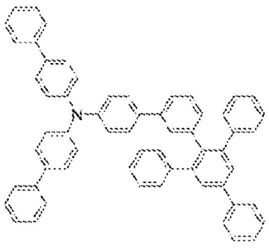
Figure 8:
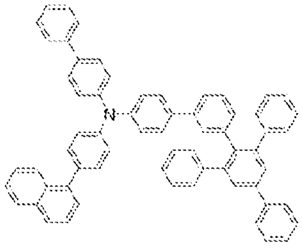
Figure 8:
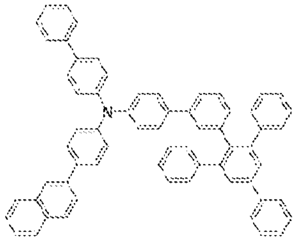
Figure 9:
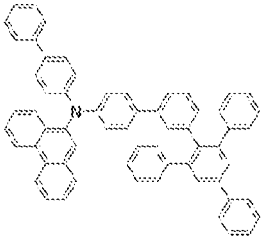
FIG. 9 is a diagram showing structural formulae of Compounds 1-121 to 1-135 as examples of the arylamine compound represented by the general formula (1).
Figure 9:
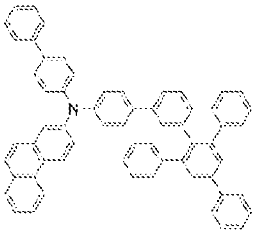
Figure 9:
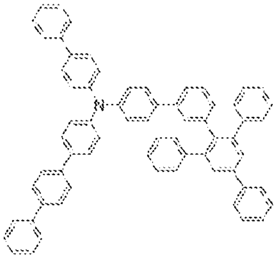
Figure 9:
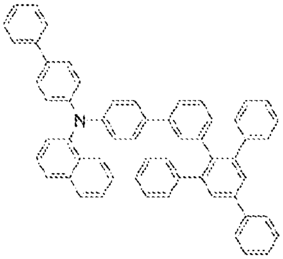
Figure 9:
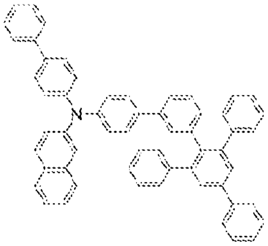
Figure 9:
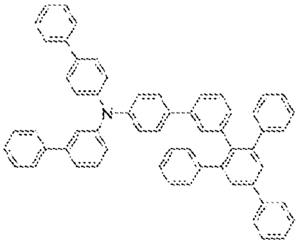
Figure 9:
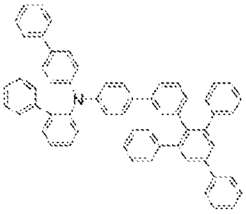
Figure 9:
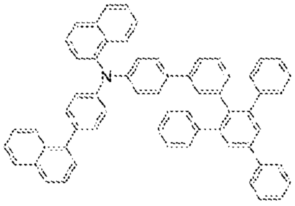
Figure 9:
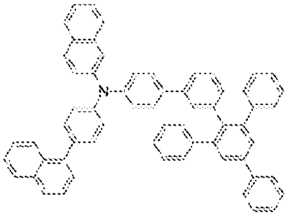
Figure 9:
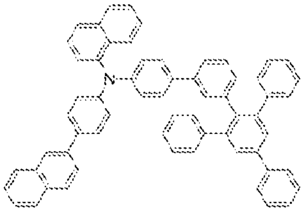
Figure 9:
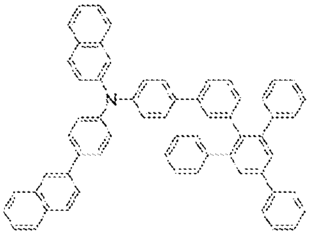
Figure 9:
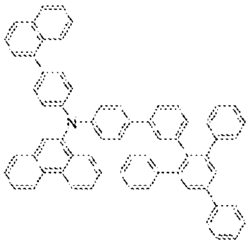
Figure 9:
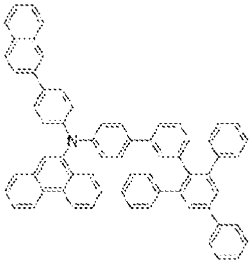
Figure 9:
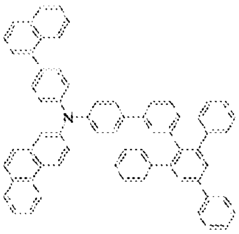
Figure 9:
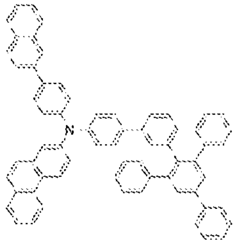
Figure 10:
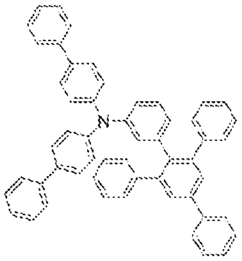
FIG. 10 is a diagram showing structural formulae of Compounds 1-136 to 1-150 as examples of the arylamine compound represented by the general formula (1).
Figure 10:
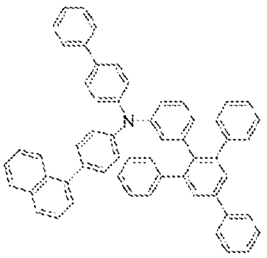
Figure 10:
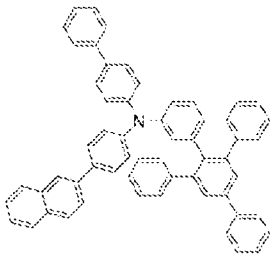
Figure 10:
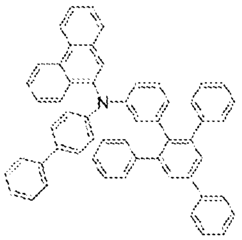
Figure 10:
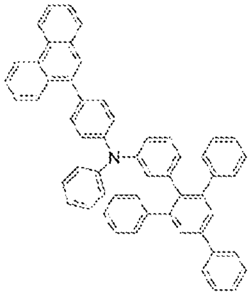
Figure 10:
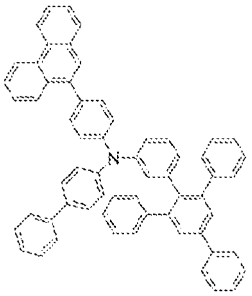
Figure 10:
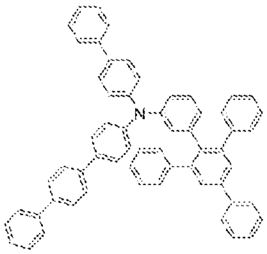
Figure 10:
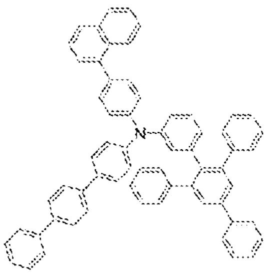
Figure 10:
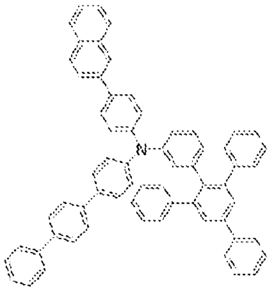
Figure 10:
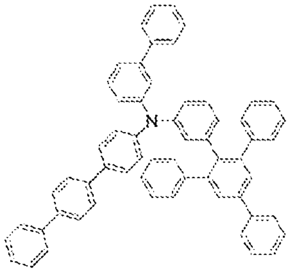
Figure 10:
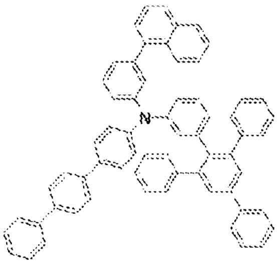
Figure 10:
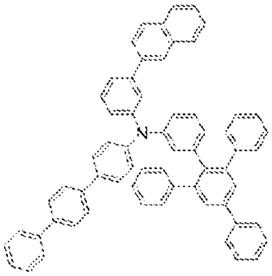
Figure 10:
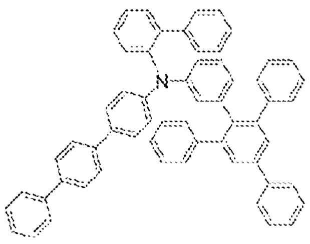
Figure 10:
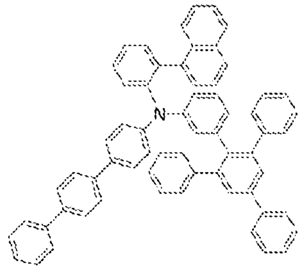
Figure 10:
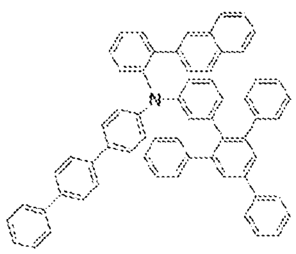
Figure 11:
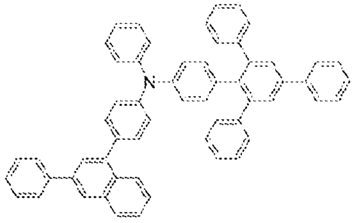
FIG. 11 is a diagram showing structural formulae of Compounds 1-151 to 1-165 as examples of the arylamine compound represented by the general formula (1).
Figure 11:
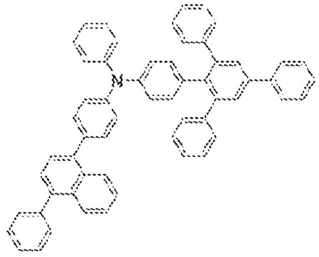
Figure 11:
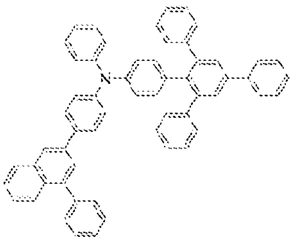
Figure 11:
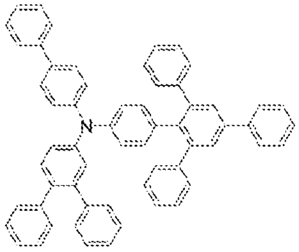
Figure 11:
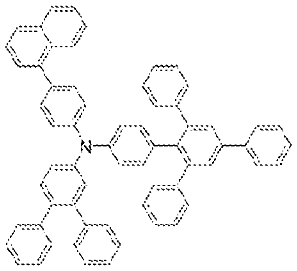
Figure 11:
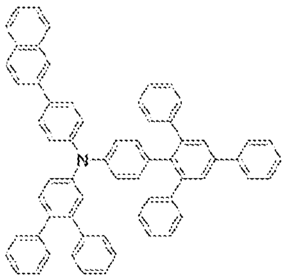
Figure 11:
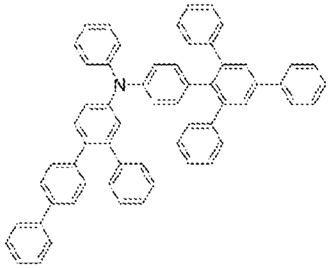
Figure 11:
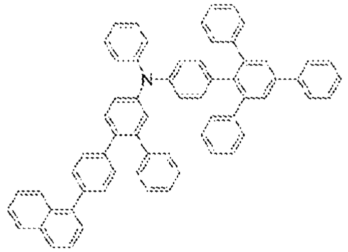
Figure 11:
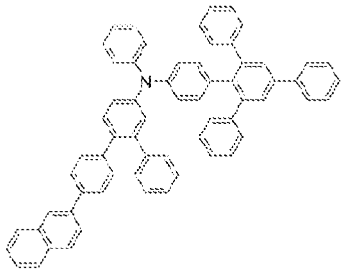
Figure 11:
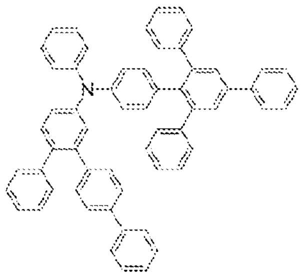
Figure 11:
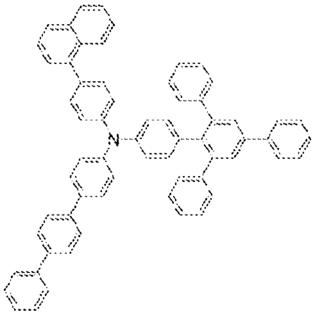
Figure 11:
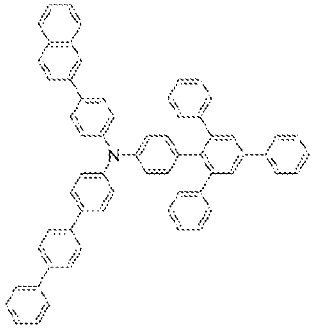
Figure 11:
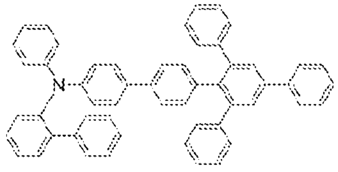
Figure 11:
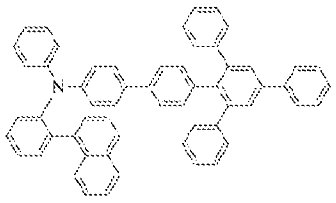
Figure 11:
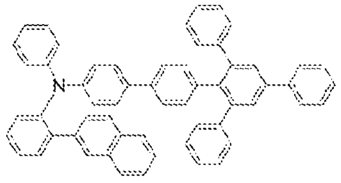
Figure 12:
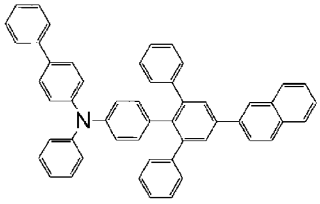
FIG. 12 is a diagram showing structural formulae of Compounds 1-166 to 1-178 as examples of the arylamine compound represented by the general formula (1).
Figure 12:
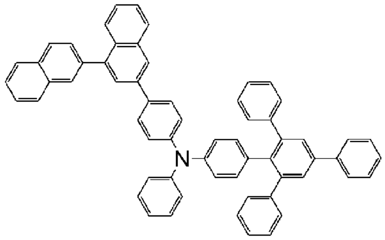
Figure 12:
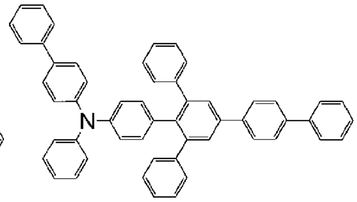
Figure 12:
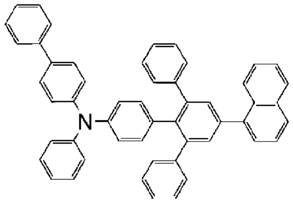
Figure 12:
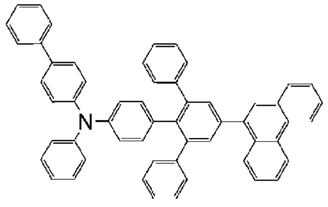
Figure 12:
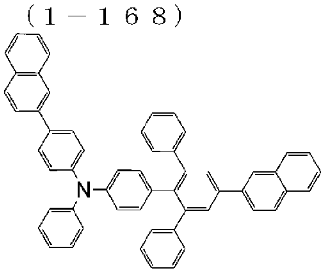
Figure 12:
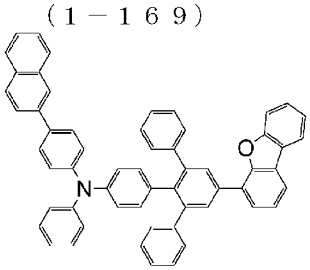
Figure 12:
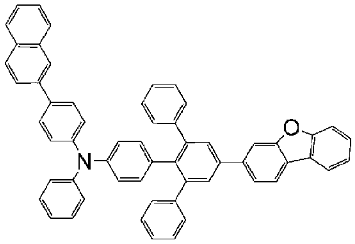
Figure 12:
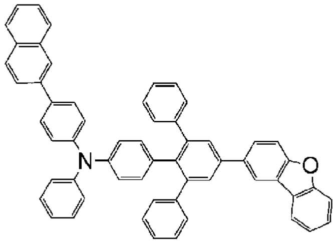
Figure 12:
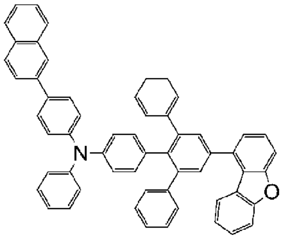
Figure 12:
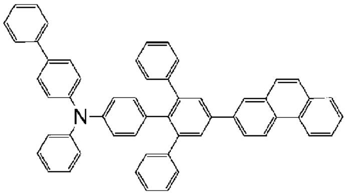
Figure 12:
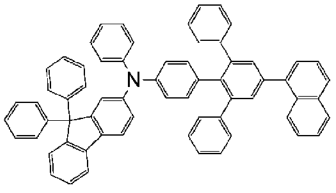
Figure 12:
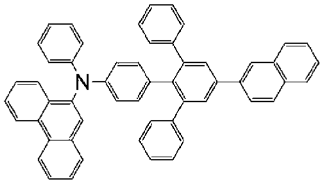
Figure 13:
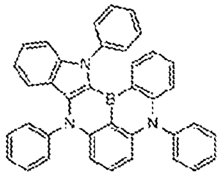
FIG. 13 is a diagram showing structures of Compounds 2-1 to 2-15 as examples of a compound represented by the general formula (2).
Figure 13:
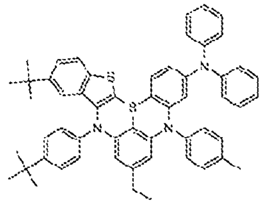
Figure 13:
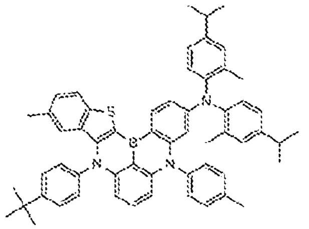
Figure 13:
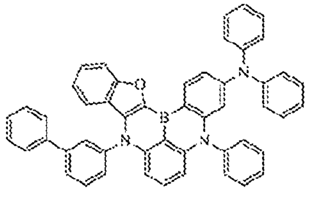
Figure 13:
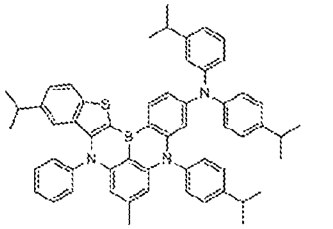
Figure 13:
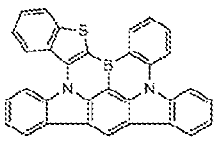
Figure 13:
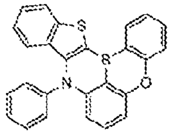
Figure 13:
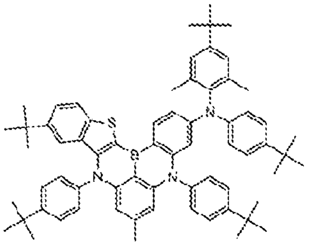
Figure 13:
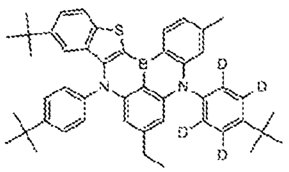
Figure 13:
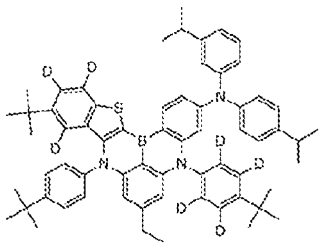
Figure 13:
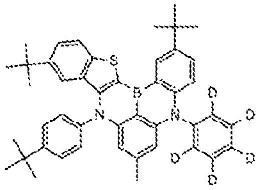
Figure 13:
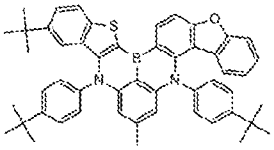
Figure 13:
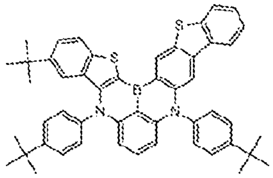
Figure 13:
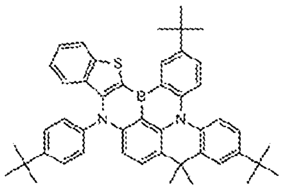
Figure 13:
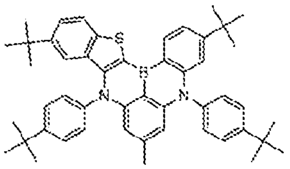
Figure 14:
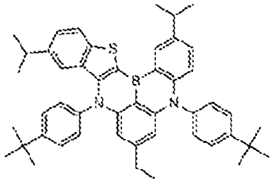
FIG. 14 is a diagram showing structural formulae of Compounds 2-16 to 2-24 as examples of the compound represented by the general formula (2).
Figure 14:
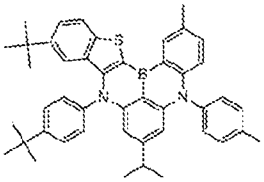
Figure 14:
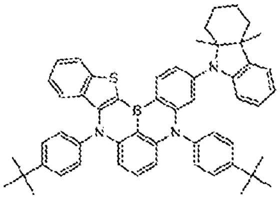
Figure 14:
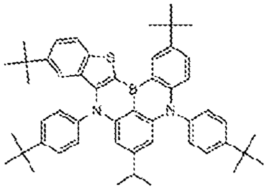
Figure 14:
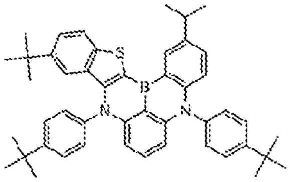
Figure 14:
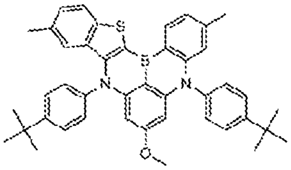
Figure 14:
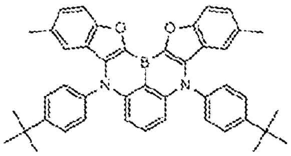
Figure 14:
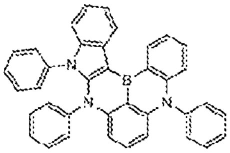
Figure 14:
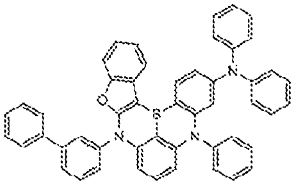
Figure 15:
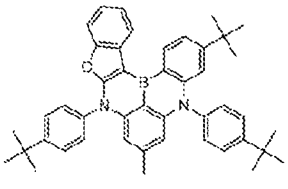
FIG. 15 is a diagram showing structures of Compounds 3-1 to 3-6 as examples of a compound represented by the general formula (3).
Figure 15:
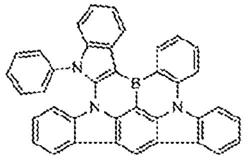
Figure 15:
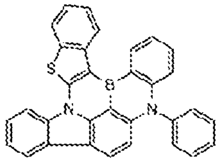
Figure 15:
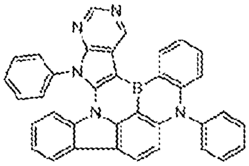
Figure 15:
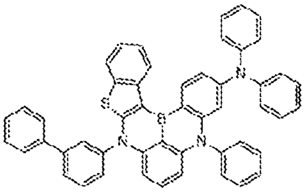
Figure 15:
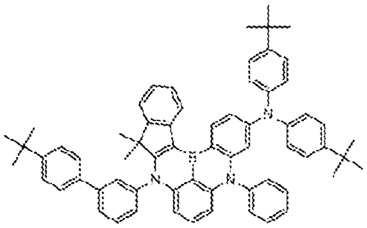

An embodiment of the present invention is described in detail below. First, aspects of the embodiment will be listed and described.

1) An organic electroluminescent device including:

an anode and a cathode; and at least a first hole transport layer, a second hole transport layer, a blue light emitting layer, and an electron transport layer in this order from an anode side between the anode and the cathode, in which at least one layer of the layers disposed between the first hole transport layer and the electron transport layer contains an arylamine compound represented by the following general formula (1),

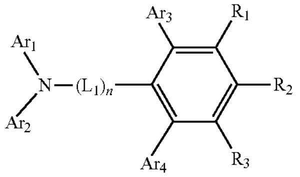

(1)

(In formula, $Ar_1$, $Ar_2$, $Ar_3$, and $Ar_4$ may be the same as or different from each other, and each represent a substituted or unsubstituted aromatic hydrocarbon group, a substituted or unsubstituted aromatic heterocyclic group, or a substituted or unsubstituted condensed polycyclic aromatic group, $L_1$ represents a divalent group of a substituted or unsubstituted aromatic hydrocarbon, a divalent group of a substituted or unsubstituted aromatic heterocycle, or a divalent group of a substituted or unsubstituted condensed polycyclic aromatic, $R_1$, $R_2$, and $R_3$ may be the same as or different from each other, and each represent a hydrogen atom, a deuterium atom, a fluorine atom, a chlorine atom, a cyano group, a nitro group, a linear or branched alkyl group having a carbon number of 1 to 6 which may have a substituent, a cycloalkyl group having a carbon number of 5 to 10 which may have a substituent, a linear or branched alkenyl group having a carbon number of 2 to 6 which may have a substituent, a linear or branched alkyloxy group having a carbon number of 1 to 6 which may have a substituent, a cycloalkyloxy group having a carbon number of 5 to 10 which may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy group, and n represents an integer of 1 to 3).

2) The organic electroluminescent device according to the item 1), in which at least one of the layers disposed between the first hole transport layer and the blue light emitting layer contains the arylamine compound represented by the foregoing general formula (1).

3) The organic electroluminescent device according to the item 1) or 2), in which a layer adjacent to the blue light emitting layer among the layers disposed closer to the anode side than the blue light emitting layer contains the arylamine compound represented by the foregoing general formula (1).

4) The organic electroluminescent device according to any one of the items 1) to 3), in which the second hole transport layer contains the arylamine compound represented by the foregoing general formula (1).

5) The organic electroluminescence device according to any one of the items 1) to 4), in which $R_1$ and $R_3$ in the foregoing general formula (1) may be the same as or different from each other and are a hydrogen atom or a deuterium atom.

6) The organic electroluminescence device according to any one of the items 1) to 5), in which n in the foregoing general formula (1) is 1 or 2.

7) The organic electroluminescence device according to any one of the items 1) to 6), in which $L_1$ in the foregoing general formula (1) is a substituted or unsubstituted phenylene group.

8) The organic electroluminescence device according to any one of the items 1) to 7), in which the blue light emitting layer contains a blue light emitting dopant.

9) The organic electroluminescence device according to the item 8), in which the blue light emitting dopant is a compound represented by the following general formula (2) or (3).

(2)

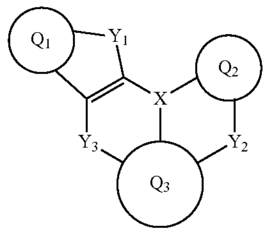

(3)

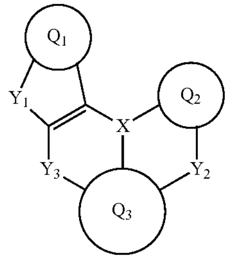

(In formulae (2) and (3), $Q_1$ to $Q_3$ may be the same as or different from each other, and each represent a substituted or unsubstituted aromatic hydrocarbon or a substituted or unsubstituted aromatic heterocycle, X represents B, P, P═O, or P═S, $Y_1$ to $Y_3$ may be the same as or different from each other, and are any one selected from N—$R_4$, C—$R_5R_6$, O, S, Se, and Si—$R_7R_8$, $R_4$ to $R_8$ may be the same as or different from each other, and each represent a hydrogen atom, a deuterium atom, a fluorine atom, a chlorine atom, a cyano group, a nitro group, a linear or branched alkyl group having a carbon number of 1 to 6 which may have a substituent, a cycloalkyl group having a carbon number of 5 to 10 which may have a substituent, a linear or branched alkenyl group having a carbon number of 2 to 6 which may have a substituent, a linear or branched alkyloxy group having a carbon number of 1 to 6 which may have a substituent, a cycloalkyloxy group having a carbon number of 5 to 10 which may have a substituent, a substituted or unsubstituted aromatic hydrocarbon group, or a substituted or unsubstituted aryloxy group, $R_5$ and $R_6$, or $R_7$ and $R_8$ may be bonded to each other via a single bond, a substituted or unsubstituted methylene group, an oxygen atom, or a sulfur atom to form a ring, and when $Y_1$ to $Y_3$ are N—$R_4$, C—$R_5R_6$, or Si—$R_7R_8$, $R_4$ to $R_8$ may be bonded to adjacent $Q_1$ to $Q_3$ via a linking group of a substituted or unsubstituted methylene group, an oxygen atom, a sulfur atom, or a monosubstituted amino group to form a ring).

10) The organic electroluminescent device according to any one of the items 1) to 9), in which the blue light emitting layer contains an anthracene derivative having an anthracene skeleton.

Specific examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group", which is represented by $Ar_1$ to $Ar_4$ in the general formula (1), include: a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, a triphenylenyl group, a pyridyl group, a pyrimidinyl group, a triazinyl group, a furyl group, a pyrrolyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a carborinyl group; and the like.

Specific examples of the "substituent" in the "substituted aromatic hydrocarbon group", the "substituted aromatic heterocyclic group", or the "substituted condensed polycyclic aromatic group", which is represented by $Ar_1$ to $Ar_4$ in the general formula (1), include: a deuterium atom, a cyano group, a nitro group; a halogen atom such as a fluorine atom, a chlorine atom, a bromine atom, and an iodine atom; a linear or branched alkyl group having a carbon number of 1 to 6, such as a methyl group, an ethyl group, an n-propyl group, an isopropyl group, an n-butyl group, an isobutyl group, a tert-butyl group, an n-pentyl group, an isopentyl group, a neopentyl group, and an n-hexyl group; a linear or branched alkyloxy group having a carbon number of 1 to 6, such as a methyloxy group, an ethyloxy group, and a propyloxy group; an alkenyl group such as a vinyl group and an allyl group; an aryloxy group such as a phenyloxy group and a tolyloxy group; an arylalkyloxy group such as a benzyloxy group and a phenethyloxy group; an aromatic hydrocarbon group or condensed polycyclic aromatic group such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group; an aromatic heterocyclic group such as a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, dibenzofuranyl group, a dibenzothienyl group, and a carbolinyl group; an arylvinyl group such as a styryl group and a naphthylvinyl group; an acyl group such as an acetyl group and a benzoyl group; and the like. These substituents may be further substituted by the substituents exemplified above. These substituents may be bonded to each other via a single bond, a substituted or unsubstituted methylene group, an oxygen atom or a sulfur atom to form a ring.

Specific examples of the "divalent group of an aromatic hydrocarbon", the "divalent group of an aromatic heterocycle", or the "divalent group of a condensed polycyclic aromatic" in the "divalent group of a substituted or unsubstituted aromatic hydrocarbon", the "divalent group of a substituted or unsubstituted aromatic heterocycle", or the "divalent group of a substituted or unsubstituted condensed polycyclic aromatic", which is represented by $L_1$ in the general formula (1), include: a phenylene group, a biphenylene group, a terphenylene group, a tetrakisphenylene group, a naphthylene group, an anthrylene group, a phenanthrylene group, a fluorenylene group, a phenanthrolylene group, an indenylene group, a pyrenylene group, a perylenylene group, a fluoranthenylene group, a triphenylenylene group, a pyridinylene group, a pyrimidinylene group, a quinolylene group, an isoquinolylene group, an indolylene group, a carbazolylene group, a quinoxalylene group, a benzoimidazolylene group, a pyrazolylene group, a naphthyridinylene group, a phenanthrolynylene group, an acridinylene group, a thiophenylene group, a benzothiophenylene group, a benzothiazolylene group, a dibenzothiophenylene group, and the like. In the case where n is 2 or 3, a plurality of $L_1$'s may be the same as or different from each other.

Examples of the "substituent" in the "divalent group of a substituted aromatic hydrocarbon", the "divalent group of a substituted aromatic heterocycle", or the "divalent group of a substituted condensed polycyclic aromatic", which is represented by $L_1$ in the general formula (1), are the same as those described for the "substituent" in the "substituted aromatic hydrocarbon group", the "substituted aromatic heterocyclic group", or the "substituted condensed polycyclic aromatic group", which is represented by $Ar_1$ to $Ar_4$ in the general formula (1), and the same forms can be also exemplified.

Specific examples of the "linear or branched alkyl group having a carbon number of 1 to 6", the "cycloalkyl group having a carbon number of 5 to 10", or the "linear or branched alkenyl group having a carbon number of 2 to 6" in the "linear or branched alkyl group having a carbon number of 1 to 6 which may have a substituent", the "cycloalkyl group having a carbon number of 5 to 10 which may have a substituent", or the "linear or branched alkenyl group having a carbon number of 2 to 6 which may have a substituent", which is represented by $R_1$ to $R_3$ in the general formula (1), include: a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, a 2-butenyl group, and the like. These groups may be bonded to each other via a single bond, a substituted or unsubstituted methylene group, an oxygen atom or a sulfur atom to form a ring.

Specific examples of the "substituent" in the "linear or branched alkyl group having a carbon number of 1 to 6 which has a substituent", the "cycloalkyl group having a carbon number of 5 to 10 which has a substituent", or the "linear or branched alkenyl group having a carbon number of 2 to 6 which has a substituent", which is represented by $R_1$ to $R_3$ in the general formula (1), include: a deuterium atom, a cyano group and a nitro group; a halogen atom such as a fluorine atom, a chlorine atom, a bromine atom and an iodine atom; a linear or branched alkyloxy group having a carbon number of 1 to 6 such as a methyloxy group, an ethyloxy group and a propyloxy group; an alkenyl group such as a vinyl group and an allyl group; an aryloxy group such as a phenyloxy group and a tolyloxy group; an arylalkyloxy group such as a benzyloxy group and a phenethyloxy group; an aromatic hydrocarbon group or a condensed polycyclic aromatic group such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group and a triphenylenyl group; and an aromatic heterocyclic group such as a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a carbolinyl group; and the like. These substituents may be further substituted by the substituents exemplified above. These substituents may be bonded to each other via a single bond, a substituted or unsubstituted methylene group, an oxygen atom or a sulfur atom to form a ring.

Specific examples of the "linear or branched alkyloxy group having a carbon number of 1 to 6" or the "cycloalkyloxy group having a carbon number of 5 to 10" in the "linear or branched alkyloxy group having a carbon number of 1 to 6 which may have a substituent" or the "cycloalkyloxy group having a carbon number of 5 to 10 which may have a substituent", which is represented by $R_1$ to $R_3$ in the general formula (1), include: a methyloxy group, an ethyloxy group, an n-propyloxy group, an isopropyloxy group, an n-butyloxy group, a tert-butyloxy group, an n-pentyloxy group, an n-hexyloxy group, a cyclopentyloxy group, a cyclohexyloxy group, a cycloheptyloxy group, a cyclooctyloxy group, a 1-adamantyloxy group, a 2-adamantyloxy group, and the like. These groups may be bonded to each other via a single bond, a substituted or unsubstituted methylene group, an oxygen atom or a sulfur atom to form a ring.

Examples of the "substituent" in the "linear or branched alkyloxy group having a carbon number of 1 to 6 which has a substituent" or the "cycloalkyloxy group having a carbon number of 5 to 10 which has a substituent", which is represented by $R_1$ to $R_3$ in the general formula (1), are the same as those exemplified for the "substituent" in the "linear or branched alkyl group having a carbon number of 1 to 6 which has a substituent", the "cycloalkyl group having a carbon number of 5 to 10 which has a substituent", or the "linear or branched alkenyl group having a carbon number of 2 to 6 which has a substituent", which is represented by $R_1$ to $R_3$ in the general formula (1), and the same forms can be also exemplified.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group", which is represented by $R_1$ to $R_3$ in the general formula (1), are the same as those exemplified for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group", which is represented by $Ar_1$ to $Ar_4$ in the general formula (1). These groups may be bonded to each other via a single bond, a substituted or unsubstituted methylene group, an oxygen atom or a sulfur atom to form a ring. These groups may have a substituent, and examples of the substituent include the same as those exemplified for the "substituent" in the "substituted aromatic hydrocarbon group", the "substituted aromatic heterocyclic group", or the "substituted condensed polycyclic aromatic group", which is represented by $Ar_1$ to $Ar_4$ in the general formula (1), and the same forms can be also exemplified.

Specific examples of the "aryloxy group" in the "substituted or unsubstituted aryloxy group", which is represented by $R_1$ to $R_3$ in the general formula (1), include: a phenyloxy group, a biphenylyloxy group, a terphenylyloxy group, a naphthyloxy group, an anthracenyloxy group, a phenanthrenyloxy group, a fluorenyloxy group, an indenyloxy group, a pyrenyloxy group, a perylenyloxy group, and the like. These groups may be bonded to each other via a single bond, a substituted or unsubstituted methylene group, an oxygen atom or a sulfur atom to form a ring. These groups may have a substituent, and examples of the substituent include the same as those exemplified for the "substituent" in the "substituted aromatic hydrocarbon group", the "substituted aromatic heterocyclic group", or the "substituted condensed polycyclic aromatic group" represented by $Ar_1$ to $Ar_4$ in the general formula (1), and the same forms can also be exemplified.

$Ar_1$ and $Ar_2$ in the general formula (1) are preferably a "substituted or unsubstituted aromatic hydrocarbon group" or a "substituted or unsubstituted condensed polycyclic aromatic group", more preferably a substituted or unsubstituted phenyl group, naphthyl group, phenanthrenyl group, or fluorenyl group, and particularly preferably a substituted or unsubstituted phenyl group or a fluorenyl group which has a substituent. Here, the substituent of the phenyl group is preferably a phenyl group, a biphenylyl group, a terphenylyl group, a naphthyl group, a phenanthrenyl group, or a fluorenyl group. The substituent of the fluorenyl group is preferably a methyl group or a phenyl group. In addition, it is preferable that $Ar_1$ and $Ar_2$ are different from each other.

$Ar_3$ and $Ar_4$ in the general formula (1) are preferably a "substituted or unsubstituted aromatic hydrocarbon group" or a "substituted or unsubstituted condensed polycyclic aromatic group", more preferably a substituted or unsubstituted phenyl group, biphenylyl group, naphthyl group, phenanthrenyl group, or fluorenyl group, and particularly preferably an unsubstituted phenyl group, an unsubstituted biphenylyl group, an unsubstituted naphthyl group, or a fluorenyl group which has a substituent. The substituent of the fluorenyl group is preferably a methyl group or a phenyl group.

$L_1$ in the general formula (1) is preferably a "divalent group of a substituted or unsubstituted aromatic hydrocarbon" or a "divalent group of a substituted or unsubstituted condensed polycyclic aromatic", more preferably a divalent group obtained by removing two hydrogen atoms from benzene, biphenyl, naphthalene, or phenanthrene, and particularly preferably a divalent group obtained by removing two hydrogen atoms from benzene, that is, a phenylene group. In this case, an unsubstituted phenylene group is preferable, and a bonding mode of the phenylene group is preferably a bonding between the para-positions and the meta-positions, or a bonding between the para-positions, that is, a 1,3-phenylene group or a 1,4-phenylene group.

n representing the number of $L_1$ represents an integer of 1 to 3, and is preferably 1 or 2.

$R_1$ and $R_3$ in the general formula (1) are preferably a hydrogen atom or a deuterium atom, and more preferably a hydrogen atom from the viewpoint of synthesis. $R_2$ in the general formula (1) is preferably a "substituted or unsubstituted aromatic hydrocarbon group" or a "substituted or unsubstituted condensed polycyclic aromatic group", more preferably a substituted or unsubstituted phenyl group, biphenylyl group, naphthyl group, phenanthrenyl group, or fluorenyl group, and particularly preferably an unsubstituted phenyl group, an unsubstituted biphenylyl group, an unsubstituted naphthyl group, or a fluorenyl group which has a substituent. The substituent of the fluorenyl group is preferably a methyl group or a phenyl group. $Ar_3$, $Ar_4$, and $R_2$ are preferably the same as each other.

Here, $Ar_1$ in the general formula (1) may be a substituted or unsubstituted phenyl group, and the substituent in the substituted phenyl may be a substituted or unsubstituted phenyl group or naphthyl group. $Ar_2$ in the general formula (1) may be a substituted phenyl group, and the substituent in the substituted phenyl may be a substituted or unsubstituted phenyl group, biphenylyl group, or naphthyl group. $Ar_3$, $Ar_4$, and $R_2$ in the general formula (1) may be an unsubstituted phenyl group, an unsubstituted biphenylyl group, an unsubstituted naphthyl group, or a fluorenyl group which has a substituent, or may be an unsubstituted phenyl group.

Specific examples of the "aromatic hydrocarbon" or the "aromatic heterocycle" in the "substituted or unsubstituted aromatic hydrocarbon" or the "substituted or unsubstituted aromatic heterocycle", which is represented by $Q_1$ to $Q_3$ in the general formulae (2) and (3), include: benzene, naphthalene, anthracene, fluorene, phenanthrene, pyridine, pyrimidine, triazine, pyrrole, furan, thiophene, quinoline, isoquinoline, indene, benzofuran, benzothiophene, indole, indoline, carbazole, carboline, benzoxazole, benzothiazole, quinoxaline, benzimidazole, pyrazole, dibenzofuran, dibenzothiophene, naphthyridine, phenanthroline, acridine, and the like.

These groups may have a substituent, and examples of the substituent are the same as those exemplified for the "substituent" in the "linear or branched alkyl group having a carbon number of 1 to 6 which has a substituent", the "cycloalkyl group having a carbon number of 5 to 10 which has a substituent", or the "linear or branched alkenyl group having a carbon number of 2 to 6 which has a substituent", which is represented by $R_1$ to $R_3$ in the foregoing general formula (1). These substituents may be bonded to each other via a single bond, a substituted or unsubstituted methylene group, an oxygen atom or a sulfur atom to form a ring.

In the general formulae (2) and (3), X represents B, P, P═O, or P═S. B is defined as a boron atom, P is defined as a phosphorus atom, P═O is defined as a phosphorus atom to which an oxygen atom is bonded by a double bond, or P═S is defined as a phosphorus atom to which a sulfur atom is bonded by a double bond. In the case where X is P═O or P═S, the phosphorus atom is a bonding site with other atoms in the general formulae (2) and (3).

$Y_1$ to $Y_3$ in the general formulae (2) and (3) may be the same as or different from each other, and are any one selected from N—$R_4$, C—$R_5R_6$, O, S, Se, and Si—$R_7R_8$. N—$R_4$ is defined as a nitrogen atom having $R_4$ as a substituent, C—$R_5R_6$ is defined as a carbon atom having $R_5$ and $R_6$ as substituents, O is defined as an oxygen atom, S is defined as a sulfur atom, Se is defined as a selenium atom, and Si—$R_7R_8$ is defined as a silicon atom having $R_7$ and $R_8$ as substituents. In the case where $Y_1$ to $Y_3$ are N—$R_4$, C—$R_5R_6$, or Si—$R_7R_8$, the nitrogen atom, the carbon atom, or the silicon atom is a bonding site with other atoms in the general formulae (2) and (3), respectively. The definitions of $R_4$ to $R_8$ will be further described in detail below.

In the case where $Y_1$ to $Y_3$ in the general formulae (2) and (3) are N—$R_4$, C—$R_5R_6$, or Si—$R_7R_8$, specific examples of the "linear or branched alkyl group having a carbon number of 1 to 6", the "cycloalkyl group having a carbon number of 5 to 10" or the "linear or branched alkenyl group having a carbon number of 2 to 6" in the "linear or branched alkyl group having a carbon number of 1 to 6 which may have a substituent", the "cycloalkyl group having a carbon number of 5 to 10 which may have a substituent", or the "linear or branched alkenyl group having a carbon number of 2 to 6 which may have a substituent", which is represented by $R_4$ to $R_5$, include: a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, a 2-butenyl group, and the like. These groups may have a substituent, and examples of the substituent are the same as those exemplified for the "substituent" in the "linear or branched alkyl group having a carbon number of 1 to 6 which has a substituent", the "cycloalkyl group having a carbon number of 5 to 10 which has a substituent", or the "linear or branched alkenyl group having a carbon number of 2 to 6 which has a substituent", which is represented by $R_1$ to $R_3$ in the foregoing general formula (1).

In the case where $Y_1$ to $Y_3$ in the general formulae (2) and (3) are N—$R_4$, C—$R_5R_6$, or Si—$R_7R_8$, specific examples of the "linear or branched alkyloxy group having a carbon number of 1 to 6" or the "cycloalkyloxy group having a carbon number of 5 to 10" in the "linear or branched alkyloxy group having a carbon number of 1 to 6 which may have a substituent" or the "cycloalkyloxy group having a carbon number of 5 to 10 which may have a substituent", which is represented by $R_4$ to $R_8$, include: a methyloxy group, an ethyloxy group, an n-propyloxy group, an isopropyloxy group, an n-butyloxy group, a tert-butyloxy group, an n-pentyloxy group, an n-hexyloxy group, a cyclopentyloxy group, a cyclohexyloxy group, a cycloheptyloxy group, a cyclooctyloxy group, a 1-adamantyloxy group, a 2-adamantyloxy group, and the like.

These groups may have a substituent, and examples of the substituent are the same as those exemplified for the "substituent" in the "linear or branched alkyl group having a carbon number of 1 to 6 which has a substituent", the "cycloalkyl group having a carbon number of 5 to 10 which has a substituent", or the "linear or branched alkenyl group having a carbon number of 2 to 6 which has a substituent", which is represented by $R_1$ to $R_3$ in the foregoing general formula (1).

In the case where $Y_1$ to $Y_3$ in the general formulae (2) and (3) are N—$R_4$, C—$R_5R_6$, or Si—$R_7R_8$, specific examples of the "aromatic hydrocarbon group" in the "substituted or unsubstituted aromatic hydrocarbon group", which is represented by $R_4$ to $R_5$, include: a phenyl group, a biphenylyl group, a terphenylyl group, a naphthyl group, an anthracenyl group, a phenanthrenyl group, and the like. These groups may have a substituent, and examples of the substituent are the same as those exemplified for the "substituent" in the "linear or branched alkyl group having a carbon number of 1 to 6 which has a substituent", the "cycloalkyl group having a carbon number of 5 to 10 which has a substituent", or the "linear or branched alkenyl group having a carbon number of 2 to 6 which has a substituent", which is represented by $R_1$ to $R_3$ in the foregoing general formula (1).

In the case where $Y_1$ to $Y_3$ in the general formulae (2) and (3) are N—$R_4$, C—$R_5R_6$, or Si—$R_7R_8$, specific examples of the "aryloxy group" in the "substituted or unsubstituted aryloxy group", which is represented by $R_4$ to $R_8$, include: a phenyloxy group, a biphenylyloxy group, a terphenylyloxy group, a naphthyloxy group, an anthracenyloxy group, a phenanthrenyloxy group, a fluorenyloxy group, an indenyloxy group, a pyrenyloxy group, a perylenyloxy group, and the like. These groups may have a substituent, and examples of the substituent are the same as those exemplified for the "substituent" in the "linear or branched alkyl group having a carbon number of 1 to 6 which has a substituent", the "cycloalkyl group having a carbon number of 5 to 10 which has a substituent", or the "linear or branched alkenyl group having a carbon number of 2 to 6 which has a substituent", which is represented by $R_1$ to $R_3$ in the foregoing general formula (1).

In the general formulae (2) and (3), the "aromatic hydrocarbon" or the "aromatic heterocycle" in the "substituted or unsubstituted aromatic hydrocarbon" or the "substituted or unsubstituted aromatic heterocycle" of $Q_1$ to $Q_3$ is preferably benzene, naphthalene, phenanthrene, pyridine, pyrimidine, indene, benzofuran, benzothiophene or indole, and more preferably benzene or naphthalene.

In the general formulae (2) and (3), $Y_1$ is preferably N—$R_4$, O, or S, and more preferably O or S. In the general formula (2), at least one of $Y_2$ and $Y_3$ is preferably N—$R_4$, and both are more preferably N—$R_4$. $R_4$ is preferably a "substituted or unsubstituted aromatic hydrocarbon group", and more preferably a substituted or unsubstituted phenyl group, biphenylyl group, terphenylyl group, or naphthyl group. In the general formulae (2) and (3), X may be B.

Specific examples of preferred compounds, among the arylamine compounds which are represented by the foregoing general formula (1) and are preferably used for the organic EL device of the present embodiment are shown in FIGS. 1 to 12. However, the invention is not limited to these compounds.

The arylamine compound represented by the general formula (1) may be purified by purification using column chromatography, adsorption purification using silica gel, activated carbon, activated clay, or the like, recrystallization or crystallization using a solvent, sublimation purification, or the like. The compound may be identified by NMR analysis. As physical property values, a melting point, a glass transition point (Tg), and a work function may be measured. The melting point serves as an index of a vapor deposition property. The glass transition point (Tg) serves as an index of stability of a thin film state. The work function serves as an index of a hole transport property and a hole blocking property. In addition, the compound used in the organic EL device according to the present embodiment may be purified by purification using column chromatography, adsorption purification using silica gel, activated carbon, activated clay, or the like, recrystallization or crystallization using a solvent, sublimation purification, or the like, and then finally purified by sublimation purification.

The melting point and the glass transition point (Tg) are measured with a high sensitivity differential scanning calorimeter (DSC3100SA, manufactured by Bruker AXS, Inc.) by using a powder of the compounds. The glass transition point of the compound represented by the general formula (1) is not particularly limited, but is preferably 80° C. or higher, more preferably 100° C. or higher, and particularly preferably 110° C. or higher from the viewpoint of stability of the formed thin film. The upper limit of the glass transition point is not particularly limited, and for example, a compound having a glass transition temperature of 250° C. or lower can be used.

The work function is determined by producing a thin film of 100 nm on an ITO substrate and measuring the thin film by an ionization potential measuring device (PYS-202, manufactured by Sumitomo Heavy Industries, ltd.). The work function of a vapor-deposited film having a film thickness of 100 nm formed on the ITO substrate by using the compound represented by the general formula (1) is not particularly limited, and is preferably larger than 5.4 eV. The upper limit of the work function of the vapor-deposited film is not particularly limited, and, for example, a vapor-deposited film having a work function of 7.0 eV or less can be used.

Examples of a structure of the organic EL device according to the present embodiment include a structure including an anode, a hole transport layer, a light emitting layer, an electron transport layer, and a cathode in this order on a substrate, a structure including a hole injection layer between the anode and the hole transport layer, a structure having a hole blocking layer between the light emitting layer and the electron transport layer, and a structure having an electron injection layer between the electron transport layer and the cathode. In these multilayer structures, it is possible to omit or combine several layers of the organic layers, and the structure can have, for example, a configuration in which a hole injection layer and a hole transport layer are combined, a configuration in which an electron injection layer and an electron transport layer are combined, or the like. The structure can have a configuration in which two or more organic layers having the same function are laminated, and examples of the configuration include a configuration in which two hole transport layers are laminated, a configuration in which two light emitting layers are laminated, a configuration in which two electron transport layers are laminated, and the like. As the structure of the organic EL device according to the present embodiment, it is preferable that the hole transport layer has a two-layer structure of a first hole transport layer and a second hole transport layer. In this case, the second hole transport layer is adjacent to the light emitting layer and has a function as an electron blocking layer.

As the anode of the organic EL device according to the present embodiment, an electrode material having a large work function, such as ITO or gold, is used. As the hole injection layer of the organic EL device according to the present embodiment, it is possible to use a material such as a starburst type triphenyl amine derivative and various triphenyl amine tetramers; a porphyrin compound represented by copper phthalocyanine; a heterocyclic compound having acceptor properties or coating type polymer material, such as hexacyano azatriphenylene; and the like. These materials can form a thin film by a publicly known method such as a spin coating method or an inkjet method in addition to a vapor deposition method.

As the hole transport layer of the organic EL device according to the present embodiment, the arylamine compounds represented by the foregoing general formula (1) can be used. Examples of materials having a hole transport property, which can be mixed or simultaneously used with the arylamine compounds represented by the general formula (1) include: benzidine derivatives such as N,N'-diphenyl-N,N'-di(m-tolyl)benzidine (TPD), N,N'-diphenyl-N,N'-di(α-naphthyl)benzidine (NPD), and N,N,N',N'-tetrabiphenylyl benzidine; 1,1-bis[4-(di-4-tolylamino) phenyl]cyclohexane (TAPC); triphenylamine derivatives represented by the foregoing general formula (1); and compounds such as various triphenylamine derivatives. These materials may be used to form a film alone, may be used as a single layer formed by being mixed with another material, or may be used in a laminated structure of layers each formed alone, layers each formed by being mixed with another material, or a layer formed alone and a layer formed by being mixed with another material. These materials can form a thin film by a publicly known method such as a spin coating method or an inkjet method in addition to a vapor deposition method.

In the hole injection layer or the hole transport layer, a material obtained by further P-doping trisbromophenylamine hexachloroantimony, radialene derivatives (see, e.g., Patent Literature 7) or the like with a material generally used for the layer, a polymer compound having a structure of a benzidine derivative such as TPD in its partial structure, and the like can be used.

In the case where the hole transport layer of the organic EL device according to the present embodiment has a two-layer structure of the first hole transport layer and the second hole transport layer, the arylamine compounds represented by the foregoing general formula (1) are used as the second hole transport layer adjacent to the light emitting layer. Examples of materials having a hole transport property, which can be mixed or simultaneously used with the arylamine compounds represented by the foregoing general formula (1) include: carbazole derivatives such as 4,4',4"-tri(N-carbazolyl)triphenylamine (TCTA), 9,9-bis[4-(carbazole-9-yl)phenyl]fluorene, 1,3-bis(carbazole-9-yl)benzene (mCP), and 2,2-bis(4-carbazole-9-ylphenyl)adamantane (Ad-Cz); and compounds having an electron blocking effect, such as a compound having a triarylamine structure and a triphenylsilyl group, represented by 9-[4-(carbazole-9-yl) phenyl]-9-[4-(triphenylsilyl) phenyl]-9H-fluorene.

These materials may be used to form a film alone, may be used as a single layer formed by being mixed with another material, or may be used in a laminated structure of layers each formed alone, layers each formed by being mixed with another material, or a layer formed alone and a layer formed by being mixed with another material. These materials can form a thin film by a publicly known method such as a spin coating method or an inkjet method in addition to a vapor deposition method.

As the light emitting layer of the organic EL device according to the present embodiment, various metal complexes, anthracene derivatives, bis styryl benzene derivatives, pyrene derivatives, oxazole derivatives, polyparaphenylene vinylene derivatives, and the like can be used in addition to the metal complexes of the quinolinol derivatives, which includes $Alq_3$ typically. The light emitting layer may be constituted by a host material and a dopant material. As the host material, the anthracene derivatives are preferably used, and in addition to the foregoing light-emitting material, heterocyclic compounds having an indole ring as a partial structure of a condensed ring, heterocyclic compounds having a carbazole ring as a partial structure of a condensed ring, carbazole derivatives, thiazole derivatives, benzimidazole derivatives, polydialkyl fluorene derivatives, and the like can be used. As the dopant material, pyrene derivatives and the compounds represented by the foregoing general formula (2) are preferably used, and further, quinacridone, coumarin, rubrene, perylene, and derivatives thereof, benzopyran derivatives, indenophenanthrene derivatives, rhodamine derivatives, aminostyryl derivatives, and the like can be used. These materials may be used to form a film alone, may be used as a single layer formed by being mixed with another material, or may be used in a laminated structure of layers each formed alone, layers each formed by being mixed with another material, or a layer formed alone and a layer formed by being mixed with another material.

A phosphorescence emitter can also be used as the light-emitting material. As the phosphorescence emitter, a phosphorescence emitter of a metal complex of iridium, platinum, or the like can be used. Green phosphorescence emitters such as $Ir(ppy)_3$, blue phosphorescence emitters such as FIrpic and FIr6, red phosphorescence emitters such as Btp2Ir(acac), and the like can be used, and as the host material at this time, carbazole derivatives such as 4,4'-di(N-carbazolyl)biphenyl (CBP), TCTA, and mCP can be used as the host material having hole injection and transport properties. As the host material having an electron transport property, p-bis(triphenyl silyl)benzene (UGH2), 2,2',2"-(1,3,5-phenylene)-tris(1-phenyl-1H-benzimidazole) (TPBI), and the like can be used, and an organic EL device having a high performance can be produced.

In order to avoid concentration quenching, a phosphorescent light-emitting material is preferably doped into the host material by co-deposition in a range of 1 to 30 wt % relative to the entire light emitting layer.

Materials that emit delayed fluorescence, such as PIC-TRZ, CC2TA, PXZ-TRZ, and CDCB derivatives such as 4CzIPN can also be used as the light-emitting material (see, e.g., Non-Patent Literature 3).

These materials can form a thin film by a publicly known method such as a spin coating method or an inkjet method in addition to a vapor deposition method.

As the hole blocking layer of the organic EL device according to the present embodiment, it is possible to use compounds having a hole-blocking effect, such as phenanthroline derivatives such as bathocuproine (BCP), metal complexes of quinolinol derivatives such as aluminum (III) bis(2-methyl-8-quinolinate)-4-phenyl phenolate (hereinafter, abbreviated as BAlq), various rare earth complexes, triazole derivatives, triazine derivatives, oxadiazole derivatives, and the like. These materials may also double as materials of the electron transport layer. These materials may be used to form a film alone, may be used as a single layer formed by being mixed with another material, or may be used in a laminated structure of layers each formed alone, layers each formed by being mixed with another material, or a layer formed alone and a layer formed by being mixed with another material. These materials can form a thin film by a publicly known method such as a spin coating method or an inkjet method in addition to a vapor deposition method.

As the electron transport layer of the organic EL device according to the present embodiment, it is possible to use metal complexes of quinolinol derivatives including $Alq_3$ and BAlq, various metal complexes, triazole derivatives, triazine derivatives, oxadiazole derivatives, pyridine derivatives, pyrimidine derivatives, benzimidazole derivatives, thiadiazole derivatives, anthracene derivatives, carbodiimide derivatives, quinoxaline derivatives, pyridoindole derivatives, phenanthroline derivatives, silole derivatives, and the like. These materials may be used to form a film alone, may be used as a single layer formed by being mixed with another material, or may be used in a laminated structure of layers each formed alone, layers each formed by being mixed with another material, or a layer formed alone and a layer formed by being mixed with another material. These materials can form a thin film by a publicly known method such as a spin coating method or an inkjet method in addition to a vapor deposition method.

As the electron injection layer of the organic EL device according to the present embodiment, it is possible to use alkali metal salts such as lithium fluoride and cesium fluoride, alkaline earth metal salts such as magnesium fluoride, metal complexes of quinolinol derivatives such as lithium quinolinol, metal oxides such as aluminum oxide, metals such as ytterbium (Yb), samarium (Sm), calcium (Ca), strontium (Sr), and cesium (Cs), and the like, but this can be omitted in the preferred selection of the electron transport layer and the cathode.

Further, in the electron injection layer or the electron transport layer, it is possible to use a material that is generally used for these layers and is further N-doped with a metal such as cesium.

As the cathode of the organic EL device according to the present embodiment, an electrode material having a low work function such as aluminum, an alloy having a lower work function such as a magnesium silver alloy, a magnesium indium alloy, and an aluminum magnesium alloy, and the like can be used as an electrode material.

In the present embodiment, at least one of the layers disposed between the first hole transport layer and the electron transport layer contains the arylamine compound represented by the foregoing general formula (1). In the present embodiment, it is preferable that at least one layer of the layers disposed between the first hole transport layer and the blue light emitting layer contains the arylamine compound represented by the foregoing general formula (1). In the present embodiment, it is more preferable that the layer adjacent to the blue light emitting layer among the layers disposed closer to the anode side than the blue light emitting layer contains the arylamine compound represented by the foregoing general formula (1). In the present embodiment, it is more preferable that the second hole transport layer contains the arylamine compound represented by the foregoing general formula (1).

The embodiment of the present invention will be described more specifically by Examples, but the present invention is not limited to the following Examples.

Example 1

Synthesis of N-(4-naphthalene-1-yl-phenyl)-N,3',5'-triphenyl-[1,1':2',1":4",1'"-quaterphenyl]-4'"-amine (Compound 1-80)

To a reaction vessel in which the atmosphere was replaced with nitrogen gas, 14.3 g of aniline, 50.0 g of 4-bromo-4'-iodobiphenyl, 500 mL of toluene, and 16.1 g of t-butoxysodium were added, and nitrogen gas was introduced thereto while irradiating the mixture with ultrasonic waves for 30 minutes. Then, 3.2 g of tetrakis(triphenylphosphine)palladium was added thereto, followed by heating and stirring at 72° C. for 27 hours. After cooling to room temperature, the filtrate obtained by filtration was concentrated. The residue was purified by column chromatography to obtain 34.2 g (yield 75.7%) of 4'-bromo-N-phenyl-[1,1'-biphenyl]-4-amine as a brown powder.

To a reaction vessel in which the atmosphere was replaced with nitrogen gas, 34.1 g of 4'-bromo-N-phenyl-[1,1'-biphenyl]-4-amine, 340 mL of toluene, 32.0 g of bispinacolate diboron, and 31.0 g of potassium acetate were added, and nitrogen gas was introduced thereto while irradiating the mixture with ultrasonic waves for 30 minutes. Then, 1.7 g of diphenylphosphinoferrocene palladium dichloride was added thereto, followed by heating and stirring at 100° C. for 19 hours. After cooling to room temperature, the filtrate obtained by filtration was concentrated. The residue was purified by column chromatography to obtain 24.5 g (yield: 62.6%) of N-phenyl-4'-(4,4,5,5-tetramethyl-1,3,2-dioxaborolan-2-yl)-[1,1'-biphenyl]-4-amine as ayellowish powder.

To a reaction vessel in which the atmosphere was replaced with nitrogen gas, a solution, which was obtained by dissolving 30.4 g of 1-bromo-2,4,6-triphenylbenzene, 24.4 g of N-phenyl-4'-(4,4,5,5-tetramethyl-1,3,2-dioxaborolan-2-yl)-[1,1'-biphenyl]-4-amine, 150 mL of toluene, 90 mL of ethanol, and 13.6 g of potassium carbonate in 60 mL of water, was added, and nitrogen gas was introduced thereto while irradiating the mixture with ultrasonic waves for 30 minutes. Then, 3.8 g of tetrakis(triphenylphosphine)palladium was added thereto, followed by heating and stirring at 72° C. for 24 hours. After cooling to room temperature, the reaction solution was separated, and the organic phase was washed sequentially with water and saturated brine. The resultant was dried with anhydrous magnesium sulfate. The drying agent was removed by filtration. The filtrate was concentrated. The residue was crystallized with chlorobenzene and acetone to obtain 24.5 g (yield 67.8%) of N,3',5'-triphenyl-[1,1':2',1":4",1'"quaterphenyl]-4'"-amine as a white powder.

To a reaction vessel in which the atmosphere was replaced with nitrogen gas, 8.6 g of N,3',5'-triphenyl-[1,1':2',1":4", 1'"quaterphenyl]-4'"-amine, 5.3 g of 1-(4-bromophenyl) naphthalene, 86 mL of toluene, and 2.3 g of t-butoxysodium were added, and nitrogen gas was introduced thereto while irradiating the mixture with ultrasonic waves for 30 minutes. Then, 0.35 g of trisdibenzylideneacetone dipalladium and 0.31 g of a 50% (w/v) toluene solution of t-butylphosphine were added thereto, followed by heating and stirring at 100° C. for 24 hours. The reaction solution was cooled to 80° C. and thermally filtered to obtain a filtrate, which was then concentrated. The residue was crystallized with toluene and acetone to obtain 8.8 g (yield: 75%) of N-(4-naphthalene-1-yl-phenyl)-N,3',5'-triphenyl-[1,1':2',1":4",1'"quaterphenyl]-4'"-amine (compound 1-80) as a white powder.

(1-80)

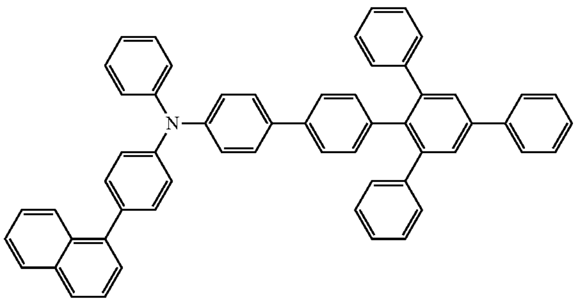

A structure of the obtained white powder was identified with NMR.

Signals of the following 41 hydrogens were detected with $^1$H-NMR ($CDCl_3$).

δ (ppm)=8.04-8.09 (1H), 8.7.85-7.96 (2H), 7.73-7.78 (4H), 7.07-7.57 (32H), 6.93-6.97 (2H).

Example 2

Synthesis of N-([1,1'-biphenyl]4-yl)-N-(4-(naphthalene-2-yl)phenyl)-3',5'-diphenyl-[1,1':2',1":3", 1'"quaterphenyl]-4'"-amine (Compound 1-120)

The same procedure as in Example 1 was carried out except that N,3',5'-triphenyl-[1,1':2',1":4",1'"quaterphenyl]-4'"-amine was changed to N-([1,1'-biphenyl]-4-yl)-3',5'-diphenyl-[1,1':2',1":3",1'"quaterphenyl]-4'-amine and 1-(4-bromophenyl)naphthalene was changed to 2-(4-bromophenyl)naphthalene, to thereby obtain 9.1 g (yield: 69%) of N-([1,1'-biphenyl]-4-yl)-N-(4-(naphthalene-2-yl) phenyl)-3',5'-diphenyl-[1,1':2',1":3",1'"quaterphenyl]-4'"-amine (compound 1-120) as a white powder.

(1-120)

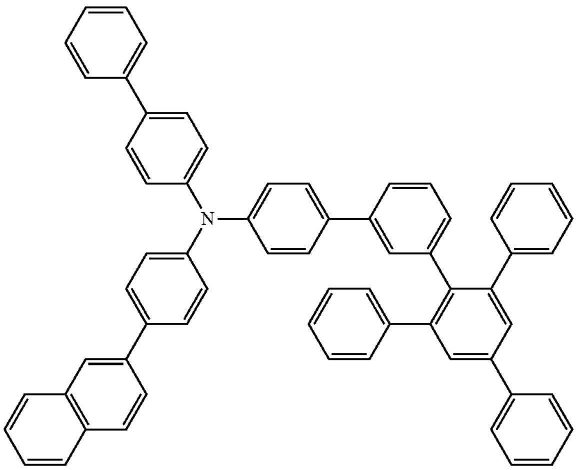

A structure of the obtained white powder was identified with NMR.

Signals of the following 45 hydrogens were detected with $^1$H-NMR ($CDCl_3$).

δ (ppm)=8.08 (1H), 7.88-7.96 (3H), 7.75-7.82 (5H), 7.62-7.70 (4H), 7.06-7.30 (31H), 6.85-6.88 (1H).

Example 3

Synthesis of N-(4-naphthalene-2-yl-phenyl))-N,3',5'-triphenyl-[1,1':2',1":4",1'"-quaterphenyl]-4'"-amine (Compound 1-81)

The same operation as in Example 1 was carried out except that 1-(4-bromophenyl)naphthalene was changed to 2-(4-bromophenyl)naphthalene, to thereby obtain 9.9 g (yield 76%) of N-(4-naphthalene-2-yl-phenyl)-N,3',5'-triphenyl-[1,1':2',1":4",1'"quaterphenyl]-4'"-amine (compound 1-81) as a white powder.

(1-81)

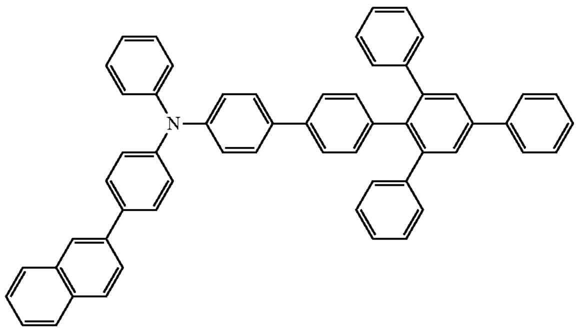

A structure of the obtained white powder was identified with NMR.

Signals of the following 41 hydrogens were detected with $^1$H-NMR ($CDCl_3$).

δ (ppm)=8.06 (1H), 7.88-7.96 (3H), 7.74-7.79 (5H), 7.63-7.68 (2H), 7.07-7.56 (28H), 6.95-6.97 (2H).

Example 4

Synthesis of N-([1,1'-biphenyl]]4-yl)-N,3',5'-triphenyl-[1,1':2',1'':4'',1'''quaterphenyl]-4'''-amine (Compounds 1-79)

To a reaction vessel in which the atmosphere was replaced with nitrogen gas, 26.0 g of N-[1,1'-biphenyl]-4-yl-4'-bromo-N-phenyl-[1,1'-biphenyl]-4-amine, 340 mL of toluene, 15.2 g of bis(pinacolate)diboron, and 8.0 g of potassium acetate were added, and nitrogen gas was introduced thereto while irradiating the mixture with ultrasonic waves for 30 minutes. Then, 0.4 g of diphenylphosphinoferrocene palladium dichloride was added thereto, followed by heating and stirring at 100° C. for 19 hours. After cooling to room temperature, the filtrate obtained by filtration was concentrated. The residue was purified by column chromatography to obtain 18.4 g (yield 64.3%) of N-[1,1'-biphenyl]-4-yl-4'-(4,4,5,5-tetramethyl-1,3,2-dioxaborolan-2-yl)-N-phenyl-[1,1'-biphenyl]-4-amine as a yellowish powder.

To a reaction vessel in which the atmosphere was replaced with nitrogen gas, a solution, which was obtained by dissolving 7.5 g of 1-bromo-2,4,6-triphenylbenzene, 12.2 g of N-[1,1'-biphenyl]-4-yl-4'-(4,4,5,5-tetramethyl-1,3,2-dioxaborolan-2-yl)-N-phenyl-[1,1'-biphenyl]-4-amine, 50 mL of toluene, 30 mL of ethanol, and 4.0 g of potassium carbonate in 20 mL of water, was added, and nitrogen gas was introduced thereto while irradiating the mixture with ultrasonic waves for 30 minutes. Then, 0.50 g of tetrakis(triphenylphosphine) palladium was added thereto, followed by heating and stirring at 72° C. for 16 hours. After cooling to room temperature, the reaction solution was separated, and the organic phase was washed sequentially with water and saturated brine. The resultant was dried with anhydrous magnesium sulfate. The drying agent was removed by filtration. The filtrate was concentrated. The residue was crystallized with toluene and acetone to obtain 8.3 g (yield: 61%) of N-([1,1'-biphenyl]-4-yl)-N,3',5'-triphenyl-[1,1':2',1'':4'',1'''quaterphenyl)-4'''-amine (compound 1-79) as a white powder.

(1-79)

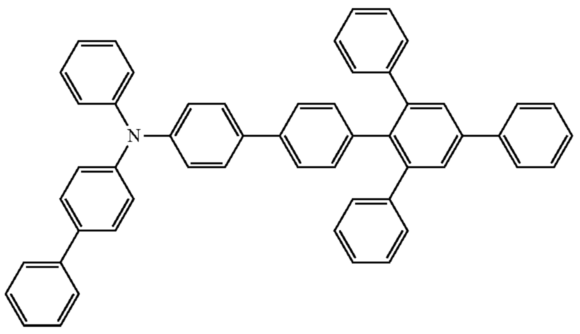

A structure of the obtained white powder was identified with NMR.

Signals of the following 39 hydrogens were detected with $^1$H-NMR ($CDCl_3$). δ (ppm)=7.77-7.80 (4H), 7.62-7.65 (2H), 7.07-7.55 (31H), 6.96-6.99 (2H).

Example 5

Synthesis of N-([1,1'-biphenyl]-4-yl)-N-(4-(naphthalen-2-yl)phenyl)-4',6'-diphenyl-[1,1':2',1''terphenyl]-4-amine (Compound 1-18)

To a reaction vessel in which the atmosphere was replaced with nitrogen gas, 117.0 g of N-(4-bromophenyl)-N-(4-(naphthalene-2-yl)phenyl)-[1,1'-biphenyl]-4-amine and 1.0 L of tetrahydrofuran were added, followed by cooling in a dry ice-methanol bath. Then, 170 mL of a hexane solution of 1.6M n-butyllithium was added thereto, followed by stirring for 30 minutes. Thereto was added 34.6 g of trimethyl borate, followed by stirring overnight while gradually increasing the temperature. Then, 2N hydrochloric acid was added to make the mixture acidic, and tetrahydrofuran was distilled off under reduced pressure. The residue was extracted with ethyl acetate and water. The organic phase was sequentially washed with water and saturated brine, and the organic phase was dried with anhydrous magnesium sulfate. The drying agent was removed by filtration, and the filtrate was concentrated. The residue was crystallized with toluene and heptane to obtain 107 g (yield 98.2%) of (4-{[1,1'-biphenyl]-4-yl}(4-(naphthalen-2-yl)phenyl)aminophenyl)boronic acid as a yellow-white powder.

To a reaction vessel in which the atmosphere was replaced with nitrogen gas, a solution, which was obtained by dissolving 40.0 g of 1-bromo-2,4,6-triphenylbenzene, 61.2 g of (4-{[1,1'-biphenyl]-4-yl}(4-(naphthalene-2-yl)phenyl)aminophenyl)boronic acid, 720 mL of 1,4-dioxane, and 66.2 g of potassium phosphate in 80 mL of water, was added, and nitrogen gas was introduced thereto while irradiating the mixture with ultrasonic waves for 30 minutes. Then, 2.9 g of trisdibenzylideneacetone dipalladium and 7.3 g of tricyclohexylphosphine were added thereto, followed by heating and stirring at 100° C. for 16 hours. The mixture was cooled to room temperature, and the precipitated solid was collected by filtration. The solid was crystallized with chlorobenzene to obtain 53.0 g (yield: 67.9%) of N-([1,1'-biphenyl]-4-yl)-N-(4-(naphthalen-2-yl)phenyl)-4',6'-diphenyl-[1,1':2',1''terphenyl]-4-amine (compound 1-18) as a white powder.

(1-18)

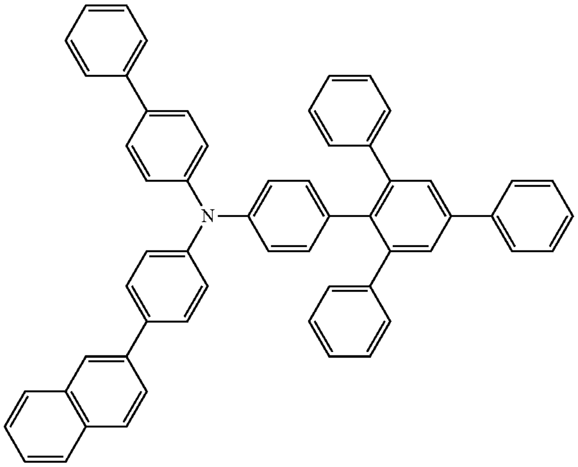

A structure of the obtained white powder was identified with NMR.

Signals of the following 41 hydrogens were detected with $^1$H-NMR ($CDCl_3$).

δ (ppm)=8.08 (1H), 7.89-7.98 (3H), 7.77-7.82 (5H), 7.64-7.67 (4H), 7.28-7.58 (20H), 7.13-7.18 (4H), 6.86-6.95 (4H).

Example 6

Synthesis of (biphenyl-4-yl)-(3',5'-diphenyl-1,1':2',1"-terphenyl-3"-yl)-(4-naphthalene-2-yl-phenyl)-amine (Compound 1-138)

To a reaction vessel in which the atmosphere was replaced with nitrogen gas, 20.0 g of (biphenyl-4-yl)-(2-naphthalenylphenyl)-4-amine, 17.5 g of 1-bromo-3-iodobenzene, 200 mL of toluene, 7.8 g of t-butoxysodium, 1.0 g of copper iodide, and 0.9 g of dimethylethylenediamine were added, followed by stirring at 100° C. for 12 hours. The mixture was cooled to 80° C. and thermally filtered to obtain a filtrate, which was then concentrated. The residue was purified by column chromatography to obtain 28.0 g (yield: 98.7%) of N-(3-bromophenyl)-N-(4-(naphthalen-2-yl)phenyl)-biphenyl-4-amine as a yellow oil.

To 28.0 g of N-(3-bromophenyl)-N-(4-naphthalene-2-yl) phenyl)-biphenyl-4-amine, 280 mL of dioxane, 17.6 g of bis(pinacolate)diboron, and 15.7 g of potassium acetate were added, and nitrogen gas was introduced thereto while irradiating the mixture with ultrasonic waves for 30 minutes. Then, 1.3 g of diphenylphosphinoferrocene palladium dichloride was added thereto, followed by heating and stirring at 100° C. for 16 hours. The mixture was cooled to 80° C. and thermally filtered to obtain a filtrate, which was then concentrated. To the residue, 300 mL of toluene was added, followed by stirring and heating, and 28 g of silica gel and 28 g of activated clay were added at 80° C. thereto, followed by stirring for 1 hour. The mixture was thermally filtered, and the filtrate was concentrated to obtain 30.5 g (yield: 100%) of N-(4-(naphthalene-2-yl)phenyl)-N-(3-(4,4,5,5-tetramethyl-1,3,2-dioxaborolan-2-yl)phenyl)-biphenyl-4-amine as a yellow oil.

To a reaction vessel, 11.0 g of 2,4,6-triphenyl-bromobenzene, 24.6 g of N-(4-(naphthalene-2-yl)phenyl)-N-(3-(4,4,5,5-tetramethyl-1,3,2-dioxaborolan-2-yl)phenyl)-biphenyl-4-amine, 0.5 g of diphenylphosphinoferrocene palladium dichloride, and 5.6 g of sodium hydrogen carbonate were charged, followed by stirring under reflux overnight in a mixed solvent of tetrahydrofuran and water. After standing to cool, ethyl acetate and water were added to the system, and the organic phase was taken out by extraction and liquid separation operations, and concentrated. The residue was purified by column chromatography to obtain 15.5 g (yield: 72.0%) of (biphenyl-4-yl)-(3',5'-diphenyl-1,1':2',1"-terphenyl-3"-yl)-(4-naphthalene-2-yl-phenyl)-amine (compound 1-138) as a white powder.

(1-138)

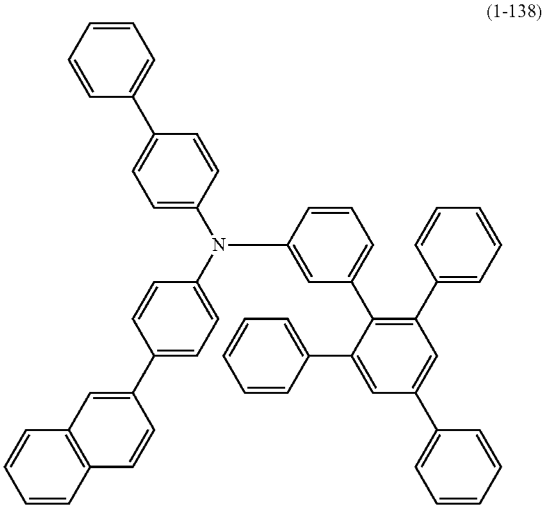 [SMILES: c1ccc(-c2ccc(N(c3ccc(-c4ccc5ccccc5c4)cc3)c3cccc(-c4c(-c5ccccc5)cc(-c5ccccc5)cc4-c4ccccc4)c3)cc2)cc1]

A structure of the obtained white powder was identified with NMR.

The following 41 hydrogen signals were detected by 1H-NMR ($CDCl_3$).

δ (ppm)=8.00 (1H), 7.83-7.89 (3H), 7.64-7.73 (5H), 7.20-7.58 (24H), 6.95-6.97 (1H), 6.81-6.90 (6H), 6.64-6.66 (1H).

Example 7

Synthesis of N,4',6'-triphenyl-N-(4-(3-phenylnaphthalene-1-yl)phenyl)-[1,1':2',1"-terphenyl]-4-amine (Compound 1-151)

To a reaction vessel in which the atmosphere was replaced with nitrogen gas, 40.0 g of 2,4,6-triphenyl-bromobenzene, 33.7 g of N-phenyl-4-(4,4,5,5-tetramethyl-1,3,2-dioxaborolan-2-yl)aniline, 1.7 g of [1,1'-bis(diphenylphosphino)ferrocene]palladium (II) dichloride, and 13.1 g of sodium hydrogen carbonate were charged, followed by stirring under reflux overnight in a mixed solvent of tetrahydrofuran and water. After standing to cool, ethyl acetate and water were added to the system, the organic phase was taken out by extraction and liquid separation operations, and concentrated to obtain a crude product. To the residue, 500 mL of toluene was added, followed by stirring and heating, and activated clay and silica gel were added thereto at 80° C., followed by stirring for 1 hour. The solid was removed by thermal filtration, and the filtrate was concentrated. The residue was recrystallized with toluene-heptane to obtain 44.3 g (yield: 90.2%) of N,4',6'-triphenyl-[1,1':2',1"-terphenyl]-4-amine as a red white powder.

To a reaction vessel in which the atmosphere was replaced with nitrogen gas, 7.5 g of N,4',6'-triphenyl-[1,1':2',1"-terphenyl]-4-amine, 7.4 g of 1-(4-bromophenyl)-3-phenylnaphthalene, 75 mL of toluene, and 2.3 g of t-butoxysodium were added, and nitrogen gas was introduced thereto while irradiating the mixture with ultrasonic waves for 30 minutes. Then, 0.1 g of palladium acetate and 0.3 g of a 50% (w/v) toluene solution of t-butylphosphine were added thereto, followed by heating and stirring at 100° C. for 4 hours. The reaction solution was cooled to 80° C. and thermally filtered to obtain a filtrate, which was then concentrated. The residue was purified by column chromatography to obtain 3.9 g (yield: 33%) of N,4',6'-triphenyl-N-(4-(3-phenylnaphthalene-1-yl)phenyl)-[1,1':2',1"-terphenyl]-4-amine (compound 1-151) as a white powder.

(1-151)

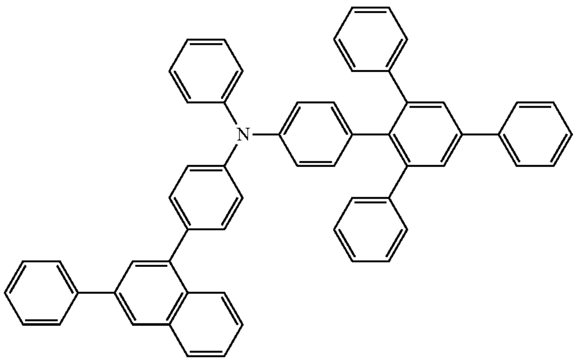

A structure of the obtained white powder was identified with NMR.

The following 41 hydrogen signals were detected by $^{1}$H-NMR ($CDCl_3$).

δ (ppm)=7.93-8.03 (3H), 7.70-7.76 (7H), 7.34-7.52 (10H), 7.19-7.24 (12H), 6.99-7.07 (5H), 6.78-6.86 (4H).

Example 8

Synthesis of N-([1,1':2',1"-terphenyl]-4'-yl)-N-(4-(naphthalen-2-yl)phenyl)-4',6'-diphenyl-[1,1':2',1"-terphenyl]-4-amine (Compound 1-156)

To a reaction vessel in which the atmosphere was replaced with nitrogen gas, 28.3 g of N-(4-(naphthalene-2-yl)phenyl)-[1,1':2',1"-terphenyl]-4'-amine, 19.7 g of 1-bromo-4-iodobenzene, 400 mL of toluene, and 8.6 g of t-butoxysodium were added, and nitrogen gas was introduced thereto while irradiating the mixture with ultrasonic waves for 30 minutes. Then, 0.28 g of palladium acetate and 0.37 g of 4,5-bis(diphenylphosphino)-9,9-dimethylxanthene were added thereto, followed by heating and stirring at 100° C. overnight. The mixture was cooled to 80° C. and thermally filtered. The filtrate was concentrated. The residue was purified by column chromatography to obtain 17.0 g (yield 44.6%) of N-(4-bromophenyl)-N-(4-(naphthalene-2-yl)phenyl)-[1,1':2',1"-terphenyl]-4'-amine as a yellowish white powder.

To a reaction vessel in which the atmosphere was replaced with nitrogen gas, 17.0 g of N-(4-bromophenyl)-N-(4-(naphthalene-2-yl)phenyl)-[1,1':2',1"-terphenyl]-4'-amine, 170 mL of toluene, 8.6 g of bis(pinacolate)diboron, and 5.5 g of potassium acetate were added, and nitrogen gas was introduced thereto while irradiating the mixture with ultrasonic waves for 30 minutes. Then, 0.5 g of diphenylphosphinoferrocene palladium dichloride was added thereto, followed by heating and stirring at 100° C. overnight. The mixture was cooled to 80° C. and thermally filtered to obtain a filtrate, which was then concentrated. The residue was purified by column chromatography to obtain 18.0 g (yield: 98.2%) of N-(4-(naphthalene-2-yl)phenyl)-N-(4-(4,4,5,5-tetramethyl-1,3,2-dioxaborolan-2-yl)phenyl)-[1,1':2',1"-terphenyl]-4'-amine as a brown oil.

To a reaction vessel in which the atmosphere was replaced with nitrogen gas, 10.0 g of 2,4,6-triphenyl-bromobenzene, 18.0 g of N-(4-(naphthalene-2-yl)phenyl)-N-(4-(4,4,5,5-tetramethyl-1,3,2-dioxaborolan-2-yl)phenyl)-[1,1':2',1"-terphenyl]-4'-amine, 0.4 g of diphenylphosphinoferrocene palladium dichloride, and 3.3 g of sodium hydrogen carbonate were charged, followed by stirring under reflux overnight in a mixed solvent of tetrahydrofuran and water. After standing to cool, ethyl acetate and water were added to the reaction solution, and the organic phase was taken out by extraction and liquid separation operations, and concentrated. The residue was dissolved in toluene, followed by stirring and heating, silica gel and activated carbon were added thereto at 80° C., followed by stirring for 1 hour, and a solid was removed by thermal filtration. The filtrate was concentrated and recrystallized with dichloromethane and acetone to obtain 15.8 g (yield: 73.5%) of N-([1,1':2',1"-terphenyl]-4'-yl)-N-(4-(naphthalen-2-yl)phenyl)-4',6'-diphenyl-[1,1':2',1"-terphenyl]-4-amine (compound 1-156) as a white powder.

(1-156)

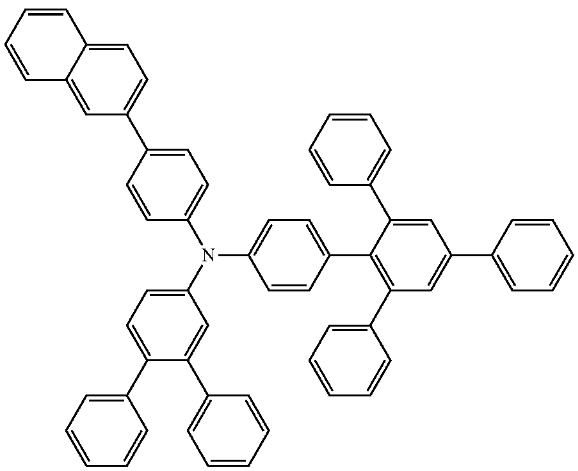

A structure of the obtained white powder was identified with NMR.

The following 45 hydrogen signals were detected by $^{1}$H-NMR ($CDCl_3$).

δ (ppm)=8.00 (1H), 7.83-7.90 (3H), 7.70-7.74 (5H), 7.57-7.59 (2H), 7.06-7.50 (30H), 6.78-6.92 (4H).

Example 9

Synthesis of N-(4-(naphthalene-2-yl)-[1,1':2',1"-terphenyl]-4'-yl)-N,4',6'-triphenyl-[1,1':2',1"-terphenyl]-4-amine (Compound 1-159)

To a reaction vessel in which the atmosphere was replaced with nitrogen gas, 13.3 g of 3-aminobiphenyl and 130 mL of dimethylformamide were added, followed by cooling to 5° C. A solution obtained by dissolving 14.0 g of N-bromosuccinimide in 50 mL of dimethylformamide was added thereto dropwise over 30 minutes. After stirring at 5° C. for 3 hours, dichloromethane and water were added to the reaction solution, followed by liquid separation. The organic phase was sequentially washed with water and saturated brine, and the organic phase was dried with anhydrous magnesium sulfate. The drying agent was removed by filtration, and the filtrate was concentrated to obtain 19.5 g (yield: 100%) of 2-bromo-[1,1'-biphenyl]-5-amine as a brown oil.

To a reaction vessel in which the atmosphere was replaced with nitrogen gas, a solution, which was obtained by dissolving 10.0 g of 2-bromo-[1,1'-biphenyl]-5-amine, 12.0 g of 4-(2-naphthalenyl)phenylboronic acid, 120 mL of tetrahydrofuran, and 5.1 g of sodium hydrogen carbonate in 30 mL of water, was added, and nitrogen gas was introduced thereto while irradiating the mixture with ultrasonic waves for 30 minutes. Then, 0.7 g of diphenylphosphinoferrocene palladium dichloride was added thereto, followed by heating and stirring under reflux for 16 hours. The mixture was cooled to room temperature, ethyl acetate and water were added to the reaction solution for liquid separation, and the organic phase was sequentially washed with water and saturated brine. The resultant was dried with anhydrous magnesium sulfate. The drying agent was removed by filtration. The filtrate was concentrated. The residue was purified by column chromatography to obtain 10.2 g (yield: 68.1%) of 4-(naphthalene-2-yl)-[1,1':2',1"-terphenyl]-4'-amine as a white powder.

To a reaction vessel in which the atmosphere was replaced with nitrogen gas, 10.1 g of 4-(naphthalene-2-yl)-[1,1':2',1"-terphenyl]-4'-amine, 3.9 g of bromobenzene, 100 mL of toluene, and 3.2 g of t-butoxysodium were added, and nitrogen gas was introduced thereto while irradiating the mixture with ultrasonic waves for 30 minutes. Then, 0.5 g of trisdibenzylideneacetone dipalladium and 0.6 g of 2,2'-bis(diphenylphosphino)-1,1'-binaphthyl were added, followed by heating and stirred at 100° C. for 4 hours. The reaction solution was cooled to 80° C. and thermally filtered to obtain a filtrate, which was then concentrated. The residue was crystallized with dichloromethane and heptane to obtain 10.4 g (yield: 93.5%) of 4-(naphthalene-2-yl)-N-phenyl-[1,1':2',1"-terphenyl]-4'-amine as a white powder.

To a reaction vessel in which the atmosphere was replaced with nitrogen gas, 50.0 g of 2,4,6-triphenyl-bromobenzene, 24.4 g of 4-chlorophenylboronic acid, 2.1 g of diphenylphosphinoferrocene palladium dichloride, and 16.4 g of sodium hydrogen carbonate were charged, followed by stirring under reflux overnight in a mixed solvent of tetrahydrofuran and water. After standing to cool, ethyl acetate and water were added to the reaction solution, and the organic phase was taken out by extraction and liquid separation operations, and concentrated. The residue was crystallized with dichloromethane and acetone to obtain 46.0 g (yield: 85.0%) of 4"-chloro-3',5'-diphenyl-1,1':2',1"-terphenyl as a white powder.

To a reaction vessel in which the atmosphere was replaced with nitrogen gas, 10.4 g of 4-(naphthalene-2-yl)-N-phenyl-[1,1':2',1"-terphenyl]-4'-amine, 8.8 g of 4"-chloro-3',5'-diphenyl-1,1':2',1"-terphenyl, 100 mL of toluene, and 4.1 g of t-butoxysodium were added, and nitrogen gas was introduced thereto while irradiating the mixture with ultrasonic waves for 30 minutes. Then, 0.22 g of bis(tri-t-butylphosphine)palladium was added thereto, followed by heating and stirring at 100° C. for 4 hours. The reaction solution was cooled to 80° C. and thermally filtered to obtain a filtrate, which was then concentrated. The residue was crystallized with dichloromethane and acetone to obtain 10.5 g (yield 60.1%) of N-(4-(naphthalene-2-yl)-[1,1':2',1"-terphenyl]-4'-yl)-N,4',6'-triphenyl-[1,1':2',1"-terphenyl]-4-amine (compound 1-159) as a white powder.

(1-159)

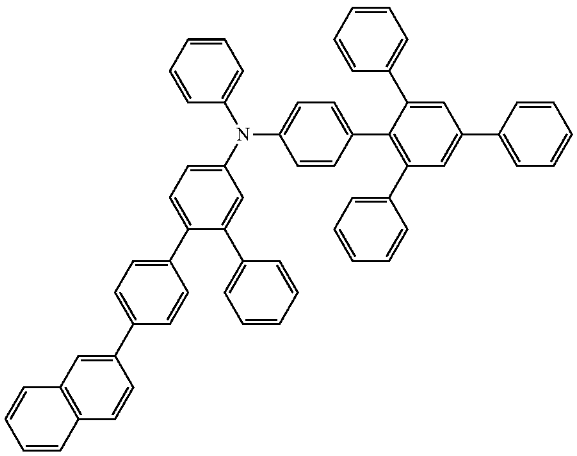

A structure of the obtained white powder was identified with NMR.

The following 45 hydrogen signals were detected by $^{1}H$-NMR ($CDCl_3$).

δ (ppm)=8.20 (1H), 7.82-7.87 (3H), 7.69-7.76 (5H), 7.56-7.59 (2H), 7.43-7.50 (4H), 6.95-7.38 (26H), 6.76-6.87 (4H).

Example 10

Synthesis of N-([1,1':4',1"-terphenyl]-4-yl)-N-(4-(naphthalen-2-yl)phenyl)-4',6'-diphenyl-[1,1':2',1"-terphenyl]-4-amine (Compound 1-162)

To a reaction vessel in which the atmosphere was replaced with nitrogen gas, 10.0 g of 4-bromo-N-(4-(naphthalene-2-yl)phenyl)aniline, 100 mL of toluene, 8.1 g of bis(pinacolate)diboron, and 5.2 g of potassium acetate were added, and nitrogen gas was introduced thereto while irradiating the mixture with ultrasonic waves for 30 minutes. Then, 0.4 g of diphenylphosphinoferrocene palladium dichloride was added thereto, followed by heating and stirring at 100° C. overnight. The mixture was cooled to 80° C. and thermally filtered to obtain a filtrate, which was then concentrated. The residue was purified by column chromatography to obtain 5.8 g (yield: 51%) of 4-(naphthalene-2-yl)-N-(4-(4,4,5,5-tetramethyl-1,3,2-dioxaborolan-2-yl)phenyl)aniline as a brown powder.

To a reaction vessel in which the atmosphere was replaced with nitrogen gas, 4.8 g of 2,4,6-triphenyl-bromobenzene, 5.8 g of 4-(naphthalene-2-yl)-N-(4-(4,4,5,5-tetramethyl-1,3,2-dioxaborolan-2-yl)phenyl)aniline, 0.2 g of diphenylphosphinoferrocene palladium dichloride, and 1.6 g of sodium hydrogen carbonate were charged, followed by stirring under reflux overnight in a mixed solvent of tetrahydrofuran and water. After standing to cool, ethyl acetate and water were added to the reaction solution, and the organic phase was taken out by extraction and liquid separation operations, and concentrated. The residue was crystallized with dichloromethane and heptane to obtain 5.5 g (yield: 73%) of N-(4-(naphthalene-2-yl)phenyl)-4',6'-diphenyl-[1,1':2',1"-terphenyl]-4-amine as a white powder.

To a reaction vessel in which the atmosphere was replaced with nitrogen gas, 5.5 g of N-(4-(naphthalene-2-yl)phenyl)-4',6'-diphenyl-[1,1':2',1"-terphenyl]-4-amine, 2.6 g of 4-bromoterphenyl, 60 mL of toluene, and 1.0 g of t-butoxysodium were added, and nitrogen gas was introduced thereto while irradiating the mixture with ultrasonic waves for 30 minutes. Then, 0.1 g of palladium acetate and 0.1 g of a 50% (w/v) toluene solution of tri-t-butylphosphine were added thereto, followed by heating and stirring at 100° C. for 4 hours. The reaction solution was cooled to 80° C., followed by thermal filtration. The filtrate was heated to 80° C., and the silica gel and activated clay were added thereto, followed by stirring for 1 hour. The solid was removed by thermal filtration, and the filtrate was concentrated. The residue was crystallized with dichloromethane and acetone to obtain 6.1 g (yield: 87%) of N-([1,1':4',1"-terphenyl]-4-yl)-N-(4-(naphthalen-2-yl)phenyl)-4',6'-diphenyl-[1,1':2',1"-terphenyl]-4-amine (compound 1-162) as a white powder.

(1-162)

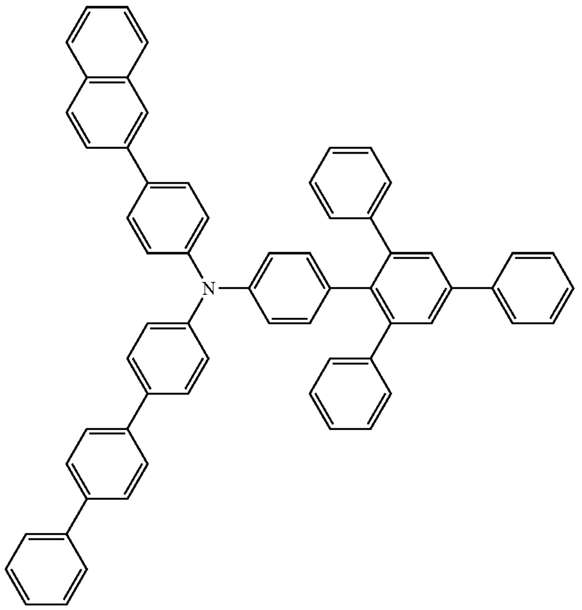

A structure of the obtained white powder was identified with NMR.

The following 45 hydrogen signals were detected by $^{1}$H-NMR ($CDCl_3$).

δ (ppm)=8.00 (1H), 7.82-7.90 (3H), 7.57-7.74 (13H), 7.21-7.52 (20H), 7.07-7.11 (4H), 6.79-6.87 (4H).

Example 11

Synthesis of N,4',6'-triphenyl-N-(4-([1,2']binaphthalenyl-3-yl)phenyl)-[1,1':2',1"-terphenyl]-4-amine (Compound 1-167)

To a reaction vessel in which the atmosphere was replaced with nitrogen gas, 6.0 g of N,4',6'-triphenyl-[1,1':2',1"-terphenyl]-4-amine, 8.6 g of 3-(4-chlorophenyl)-[1,2']binaphthalenyl, 60 mL of toluene, and 3.2 g of t-butoxysodium were added, and nitrogen gas was introduced thereto while irradiating the mixture with ultrasonic waves for 30 minutes. Then, 0.2 g of bis(tri-t-butylphosphine)palladium (0) was added thereto, followed by heating and stirring at 100° C. overnight. The reaction solution was cooled to room temperature, methanol was added thereto, and a crude product precipitated was obtained by filtration.

The obtained crude product was subjected to crystallization purification using a mixed solvent of toluene and acetone to obtain 10.5 g (yield: 80%) of N,4',6'-triphenyl-N-(4-([1,2']binaphthalenyl-3-yl)phenyl)-[1,1':2',1"-terphenyl]-4-amine (compound 1-167) as a white powder.

(1-167)

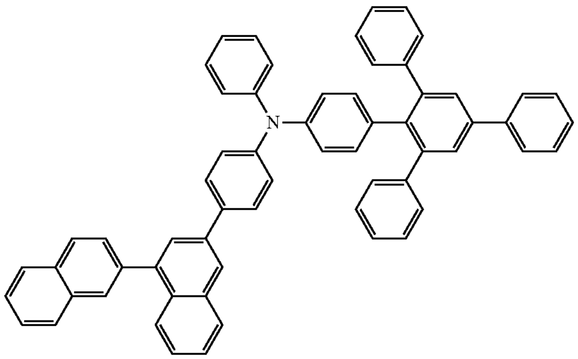

A structure of the obtained white powder was identified with NMR.

The following 43 hydrogen signals were detected by $^{1}$H-NMR ($CDCl_3$).

δ (ppm)=8.05 (1H), 8.01 (1H), 7.98 (1H), 7.97-7.88 (4H), 7.78 (1H), 7.70 (3H), 7.69 (2H), 7.61 (2H), 7.55 (2H), 7.51 (1H), 7.46 (2H), 7.41 (1H), 7.38 (1H), 7.25-7.18 (12H), 7.05 (2H), 7.01 (2H), 6.99 (1H), 6.78 (4H).

Example 12

Synthesis of N,2',6'-triphenyl-4'-naphthalene-2-yl-N-(4-naphthalen-2-yl-phenyl)-biphenyl-4-amine (Compound 1-171)

To a reaction vessel in which the atmosphere was replaced with nitrogen gas, 9.5 g of N,2',6'-triphenyl-4'-naphthalene-2-yl-biphenyl-4-amine, 5.7 g of 4-bromo-(naphthalene-2-yl)-benzene, 85 mL of toluene, and 2.3 g of t-butoxysodium were added, and nitrogen gas was introduced thereto while irradiating the mixture with ultrasonic waves for 30 minutes. Then, 0.1 g of palladium acetate and 0.2 g of a 50% (w/v) xylene solution of tri-t-butylphosphine were added thereto, followed by heating and stirring at 100° C. overnight. The reaction solution was cooled to 80° C., and silica gel and activated clay were added thereto, followed by stirring for 1 hour. The solid was removed by thermal filtration, and the filtrate was concentrated to obtain a crude product. The obtained crude product was subjected to crystallization purification using a mixed solvent of dichloromethane and methanol to obtain 8.0 g (yield: 61%) of N,2',6'-triphenyl-4'-naphthalene-2-yl-N-(4-naphthalen-2-yl-phenyl)-biphenyl-4-amine (compound 1-171) as a white powder.

(1-171)

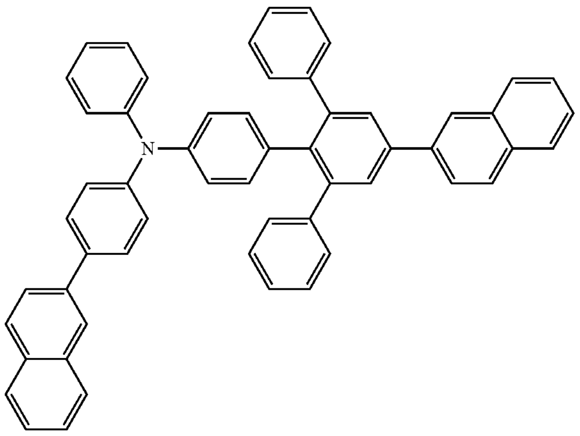

A structure of the obtained white powder was identified with NMR.

The following 39 hydrogen signals were detected by $^{1}H$-NMR ($CDCl_3$).

δ (ppm)=8.17 (1H), 7.99 (1H), 7.92 (1H), 7.90-7.83 (6H), 7.83 (2H), 7.72 (1H), 7.56 (2H), 7.53-7.42 (4H), 7.31-7.19 (12H), 7.07-6.96 (5H), 6.80 (4H).

Example 13

Synthesis of Compounds (2-11)

To a reaction vessel, 45.0 g of 1-bromobenzene (D-substitution), 58.0 g of 4-tert-butylaniline, 1.0 g of palladium (II) acetate, 30.0 g of t-butoxysodium, 2.0 g of bis(diphenylphosphino)-1,1'-binaphthyl, and 450 mL of toluene were added, followed by stirring under reflux for 24 hours. After standing to cool, the mixture was concentrated. The residue was purified by column chromatography to obtain 49.9 g (yield: 78%) of the following compound (2-11a) as a powder.

(2-11a)

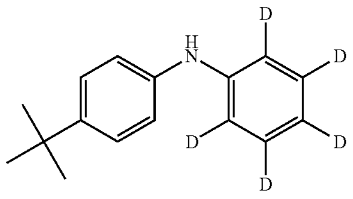

In a reaction vessel, 20.0 g of the compound (2-11a), 18.4 g of the following compound (2-11b), 0.5 g of palladium (II) acetate, 18.9 g of t-butoxysodium, 0.8 g of tri(t-butyl) phosphine, and 200 mL of toluene were added, followed by stirring under reflux for 24 hours. After standing to cool, the mixture was concentrated. The residue was purified by column chromatography to obtain 21.5 g (yield: 84%) of the following compound (2-11c) as a powder.

(2-11b)

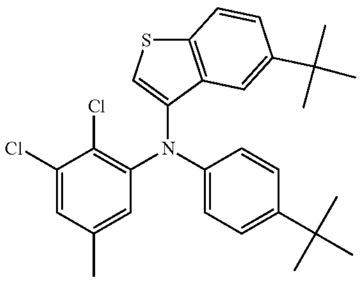

(2-11c)

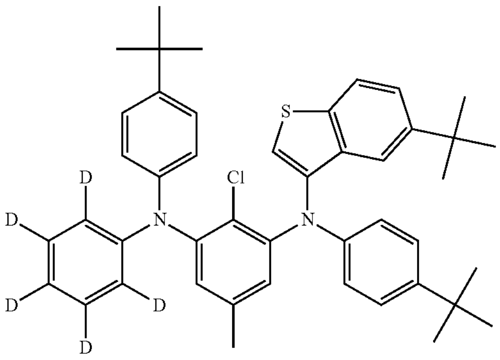

In a reaction vessel, 12.0 g of the compound (2-11c) and 120 ml of tert-butylbenzene were added, and 42.5 mL of n-butyllithium was added dropwise thereto at −78° C., and then nitrogen gas was introduced thereto while stirring at 60° C. for 3 hours. Next, 11.3 g of boron tribromide was added dropwise thereto at −78° C., followed by stirring at room temperature for 1 hour, and 5.9 g of N,N-diisopropylethylamine was added dropwise at 0° C., followed by stirring at 120° C. for 2 hours. After standing to cool, an aqueous solution of sodium acetate was added, followed by stirring, extraction was performed with ethyl acetate. The organic phase was concentrated, and then the residue was purified by column chromatography to obtain 1.7 g (yield: 11%) of the following compound (2-11) as a powder.

(2-11)

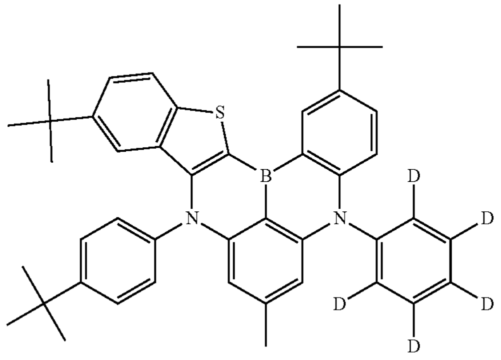

Example 14

A glass transition point of the arylamine compound represented by the general formula (1) was measured with a high sensitivity differential scanning calorimeter (DSC3100SA, manufactured by Bruker AXS, Inc.).

| | Glass transition point |
|---|---|
| Compound of Example 1 | 128.8° C. |
| Compound of Example 2 | 136.3° C. |
| Compound of Example 3 | 127.3° C. |
| Compound of Example 4 | 120.0° C. |
| Compound of Example 5 | 115.0° C. |
| Compound of Example 6 | 112.2° C. |
| Compound of Example 7 | 117.7° C. |
| Compound of Example 8 | 126.4° C. |
| Compound of Example 9 | 124.1° C. |
| Compound of Example 10 | 125.7° C. |
| Compound of Example 11 | 128.9° C. |
| Compound of Example 12 | 105.5° C. |

The arylamine compound represented by the general formula (1) has a glass transition point of 100° C. or higher, which indicates that a thin film state is stable.

Example 15

By using the arylamine compound represented by the general formula (1), a vapor-deposited film having a film thickness of 100 nm was formed on an ITO substrate, and the work function was measured by an ionization potential measuring device (PYS-202, manufactured by Sumitomo Heavy Industries, Ltd.).

| | Work function |
|---|---|
| Compound of Example 1 | 5.78 eV |
| Compound of Example 2 | 5.69 eV |
| Compound of Example 3 | 5.74 eV |
| Compound of Example 4 | 5.76 eV |
| Compound of Example 5 | 5.70 eV |
| Compound of Example 6 | 5.74 eV |
| Compound of Example 7 | 5.80 eV |
| Compound of Example 8 | 5.76 eV |
| Compound of Example 9 | 5.78 eV |
| Compound of Example 10 | 5.69 eV |
| Compound of Example 11 | 5.73 eV |
| Compound of Example 12 | 5.71 eV |

The arylamine compound represented by the general formula (1) exhibits a suitable energy level compared to a work function of 5.4 eV of a general hole transport material such as NPD or TPD, and it is understood that the arylamine compound has a good hole transport ability.

Example 16

Figure 16:
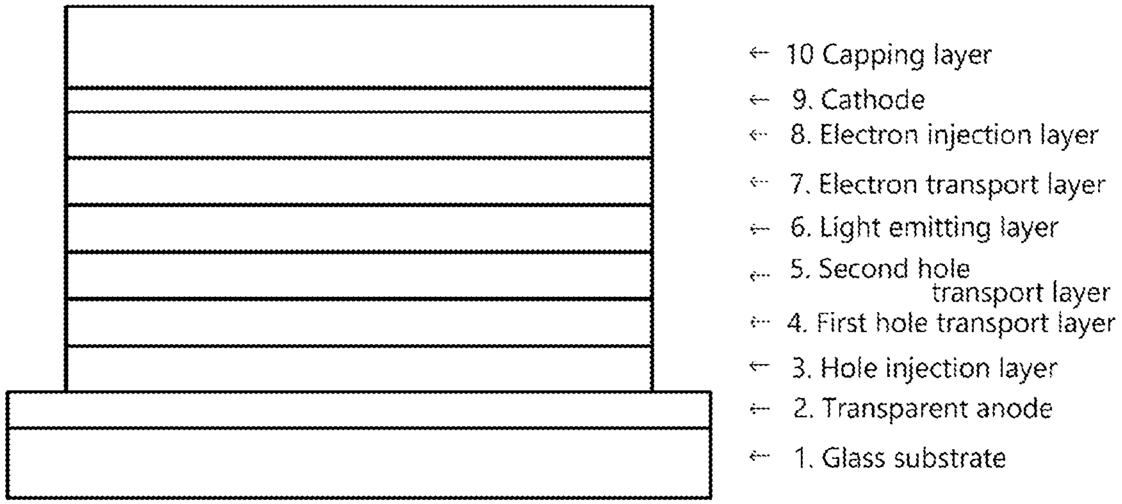
FIG. 16 is a diagram illustrating configurations of organic EL devices in Examples 16-27 and Comparative Examples 1 and 2.

As illustrated in FIG. 16, an organic EL device in this Example was prepared by depositing a hole injection layer 3, a first hole transport layer 4, a second hole transport layer 5, a light emitting layer 6, an electron transport layer 7, an electron injection layer 8, a cathode 9, and a capping layer 10 in this order on a glass substrate 1 on which a reflective ITO electrode had been formed as a transparent anode 2 in advance.

Specifically, the glass substrate 1 on which an ITO film having a thickness of 50 nm, a silver alloy reflective film having a thickness of 100 nm, and an ITO film having a thickness of 5 nm were formed in this order was ultrasonically washed in isopropyl alcohol for 20 minutes, and then was dried on a hot plate heated to 250° C. for 10 minutes. Thereafter, a UV ozone treatment was performed thereon for 15 minutes, then, the glass substrate with ITO was mounted in a vacuum deposition machine, followed by evacuating to 0.001 Pa or lower.

Subsequently, an electron acceptor (Acceptor-1) of the following structural formula and Compound (HTM-1) of the following structural formula were subjected to binary deposition on the transparent anode 2 at a deposition rate of a deposition rate ratio of (Acceptor-1): Compound (HTM-1) =3:97, so that the hole injection layer 3 to cover the transparent anode 2 was formed in a film thickness of 10 nm. On the hole injection layer 3, Compound (HTM-1) of the following structural formula was deposited to form the first hole transport layer 4 in a film thickness of 140 nm. On the first hole transport layer 4, Compound (1-80) of Example 1 was deposited to form the second hole transport layer 5 in a film thickness of 5 nm. On the second hole transport layer 5, Compound (2-11) of Example 6 and Compound (EMH-1) of the following structural formula were subjected to binary deposition at a deposition rate of a deposition rate ratio of Compound (2-11): (EMH-1)=5:95, so that the light emitting layer 6 was formed in a film thickness of 20 nm. On the light emitting layer 6, Compound (ETM-1) of the following structural formula and Compound (ETM-2) of the following structural formula were subjected to binary deposition at a deposition rate of a deposition rate ratio of Compound (ETM-1):(ETM-2)=50:50, so that the electron transport layer 7 was formed in a film thickness of 30 nm. On the electron transport layer 7, lithium fluoride was deposited to form the electron injection layer 8 in a film thickness of 1 nm. On the electron injection layer 8, magnesium silver alloy was deposited to form the cathode 9 in a film thickness of 12 nm. Finally, Compound (CPL-1) of the following structural formula was deposited to form the capping layer 10 in a film thickness of 60 nm. The prepared organic EL device was measured for physical properties in the atmosphere at normal temperature. The results of measuring the luminescence characteristics upon applying a direct current voltage to the produced organic EL device are shown in Table 1.

(Acceptor-1)

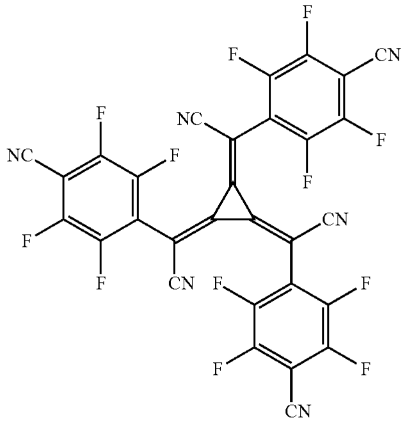

-continued (HTM-1)

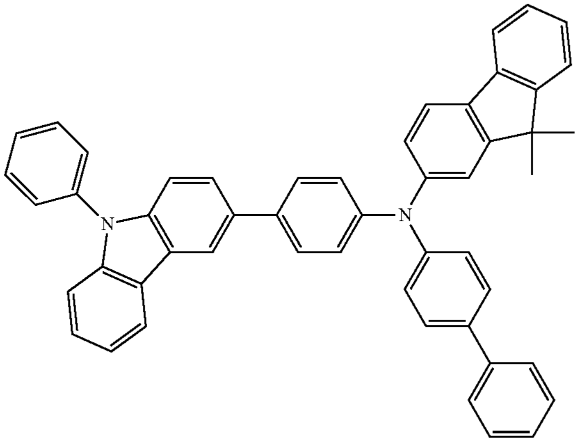

Compound (1-80)

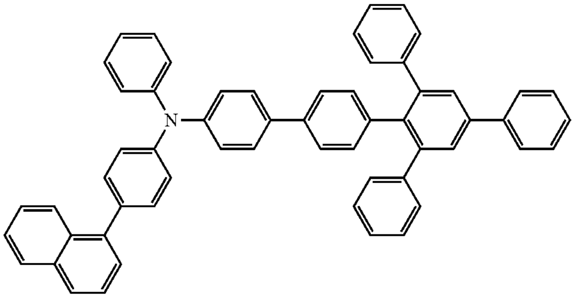

(2-11)

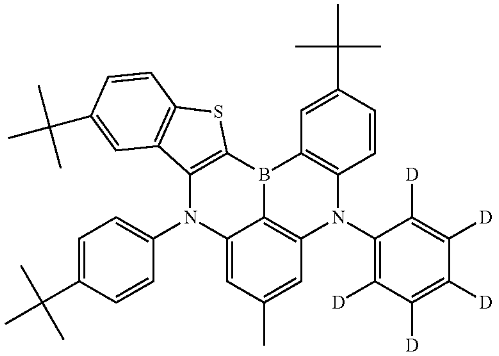

(EMH-1)

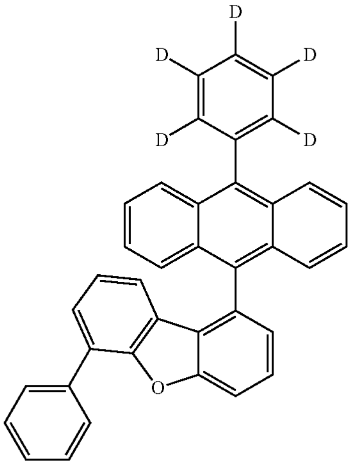

-continued (ETM-1)

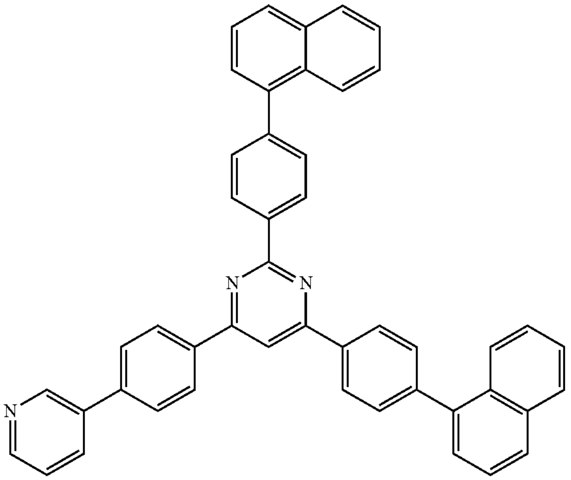

(ETM-2)

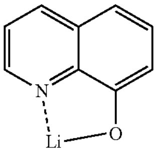

(CPL-1)

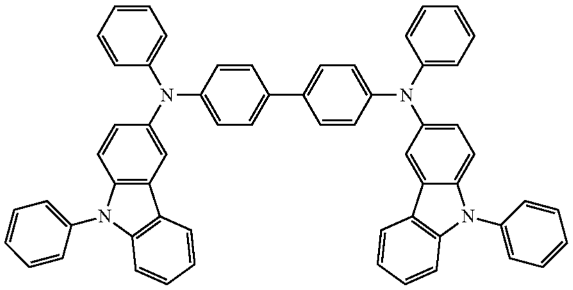

Example 17

An organic EL device was produced under the same conditions as in Example 16, except that Compound (1-120) of Example 2 was used as a material of the second hole transport laver 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-120)

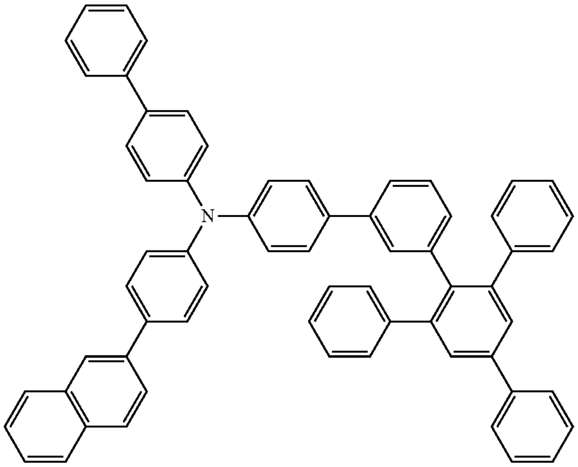

Example 18

An organic EL device was produced under the same conditions as in Example 16, except that Compound (1-81) of Example 3 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-81)

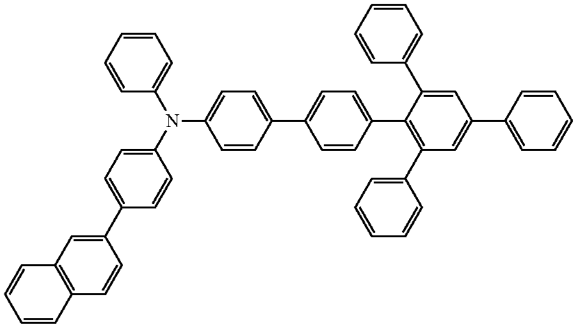

Example 19

An organic EL device was produced under the same conditions as in Example 16, except that Compound (1-79) of Example 4 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-79)

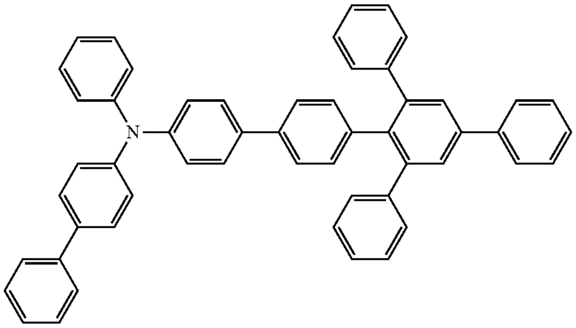

Example 20

An organic EL device was produced under the same conditions as in Example 16, except that Compound (1-18) of Example 5 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-18)

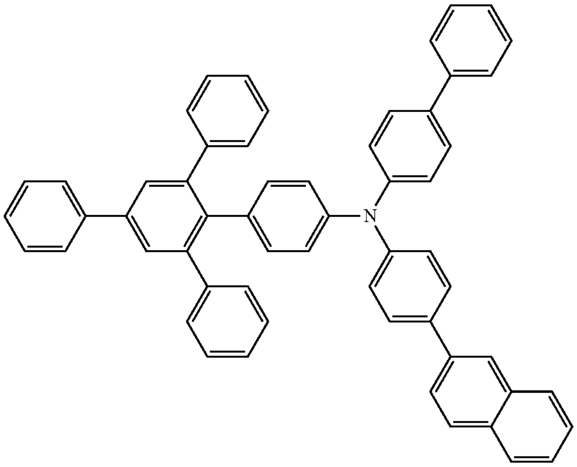

Example 21

An organic EL device was produced under the same conditions as in Example 16, except that Compound (1-138) of Example 6 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-138)

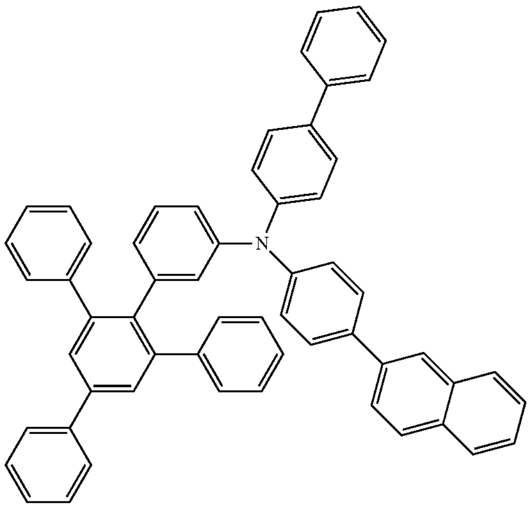

Example 22

An organic EL device was produced under the same conditions as in Example 16, except that Compound (1-151) of Example 7 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-151)

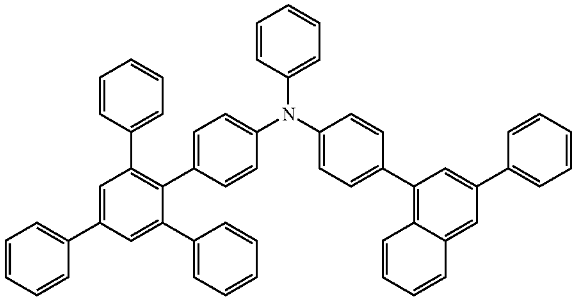

Example 23

An organic EL device was produced under the same conditions as in Example 16, except that Compounds (1-156) of Example 8 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-156)

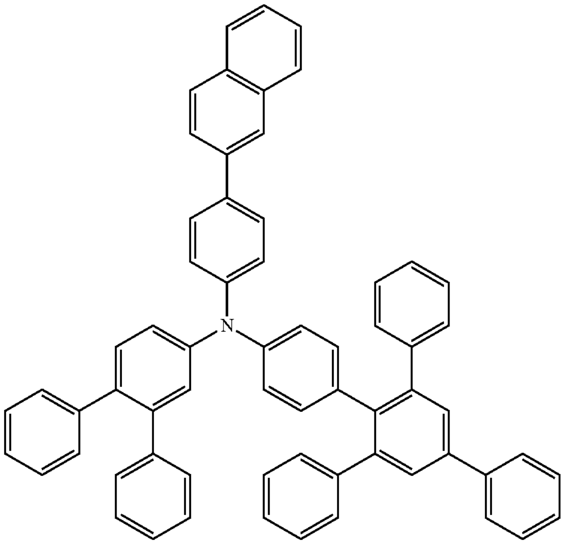

Example 24

An organic EL device was produced under the same conditions as in Example 16, except that Compound (1-159) of Example 9 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-159)

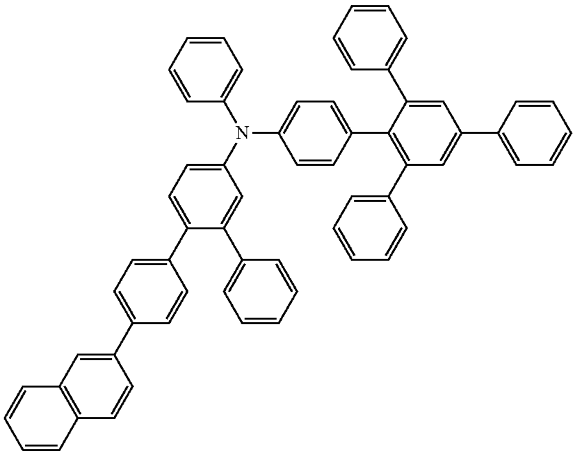

Example 25

An organic EL device was produced under the same conditions as in Example 16, except that Compound (1-162) of Example 10 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-162)

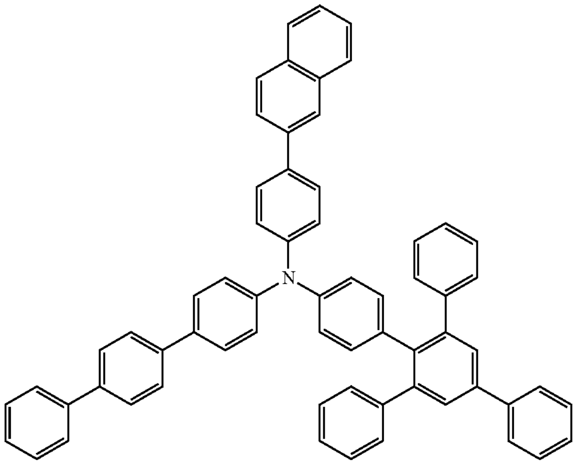

Example 26

An organic EL device was produced under the same conditions as in Example 16, except that Compound (1-167) of Example 11 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-167)

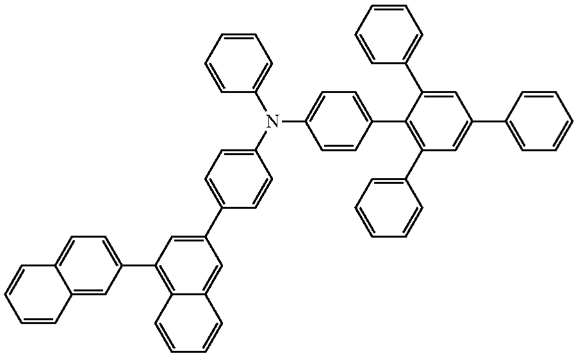

Example 27

An organic EL device was produced under the same conditions as in Example 16, except that Compound (1-171) of Example 12 was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

Compound (1-171)

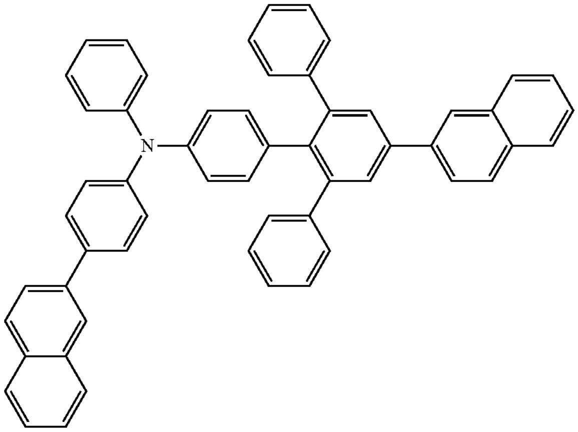

Comparative Example 1

For comparison, an organic EL device was produced under the same conditions as in Example 16, except that Compound (HTM-2) of the following structural formula was used as a material of the second hole transport layer 5 instead of Compound (1-80) of Example 1.

The prepared organic EL device was measured for characteristics in the atmosphere at normal temperature. The results of measuring the luminescence characteristics upon applying a direct current voltage to the produced organic EL device are shown in Table 1.

(HTM-2)

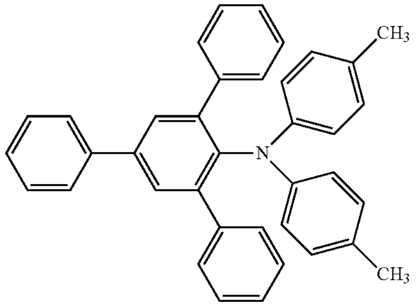

Comparative Example 2

For comparison, an organic EL device was produced under the same conditions as in Example 16, except that Compound (HTM-3) of the following structural formula was used as a material of the second hole transport layer 5 instead of Compound (1-80) of Example 1. The prepared organic EL device was measured for characteristics in the atmosphere at normal temperature. The results of measuring the luminescence characteristics upon applying a direct current voltage to the produced organic EL device are shown in Table 1.

(HTM-3)

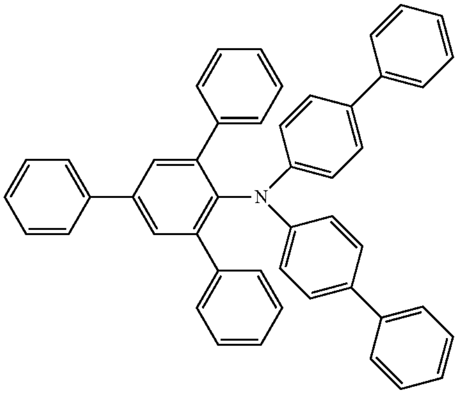

The results of measuring a device lifetime of the organic EL devices prepared in Examples 16 to 27 and Comparative Examples 1 and 2 were summarized and shown in Table 1. The device lifetime was measured as a time period from a light-emission start to a time point when the emission luminance attenuated to 1,900 cd/$m^2$ (equivalent to 95% of the initial luminance which is set as 100%: 95% attenuation), when constant-current driving was performed with the emission luminance at the light-emission start (initial luminance) being 2,000 cd/$m^2$.

TABLE 1

| | Second hole transport layer | (@10 mA/$cm^2$) Voltage [V] | Luminance [cd/$m^2$] | Luminous efficiency [cd/A] | Power efficiency [lm/W] | Device lifetime 95% attenuation |
|---|---|---|---|---|---|---|
| Ex. 16 | Compound 1-80 | 3.41 | 1045 | 10.46 | 9.49 | 498 hours |
| Ex. 17 | Compound 1-120 | 3.42 | 1004 | 10.05 | 9.23 | 448 hours |
| Ex. 18 | Compound 1-81 | 3.41 | 979 | 9.79 | 9.02 | 448 hours |
| Ex. 19 | Compound 1-79 | 3.44 | 972 | 9.73 | 8.90 | 446 hours |
| Ex. 20 | Compound 1-18 | 3.44 | 945 | 9.45 | 8.63 | 409 hours |
| Ex. 21 | Compound 1-138 | 3.43 | 1036 | 10.36 | 9.40 | 365 hours |
| Ex. 22 | Compound 1-151 | 3.45 | 996 | 9.98 | 9.04 | 322 hours |
| Ex. 23 | Compound 1-156 | 3.36 | 1017 | 10.18 | 9.53 | 452 hours |
| Ex. 24 | Compound 1-159 | 3.37 | 981 | 9.83 | 9.16 | 307 hours |
| Ex. 25 | Compound 1-162 | 3.39 | 981 | 9.81 | 9.09 | 662 hours |
| Ex. 26 | Compound 1-167 | 3.36 | 966 | 9.65 | 9.04 | 423 hours |
| Ex. 27 | Compound 1-171 | 3.36 | 987 | 9.86 | 9.23 | 536 hours |
| Comp. Ex. 1 | HTM-2 | 3.49 | 915 | 9.15 | 8.23 | 245 hours |
| Comp. Ex. 2 | HTM-3 | 3.54 | 897 | 8.97 | 8.19 | 269 hours |

As shown in Table 1, the luminous efficiency of the organic EL devices of Examples 16 to 27 when a current with a current density of 10 mA/$cm^2$ flowed in the organic EL devices was as high as 9.45 cd/A to 10.46 cd/A, as compared with 8.97 cd/A to 9.15 cd/A for the organic EL devices of Comparative Examples 1 and 2. In addition, the power efficiency of the organic EL devices of Examples 16 to 27 was as high as 8.63 lm/W to 9.53 lm/W, as compared with 8.19 lm/W to 8.23 lm/W for the organic EL devices of Comparative Examples 1 and 2. Furthermore, it is found that, for the device lifetime (95% attenuation), the organic EL devices of Examples 16 to 27 have a long lifetime of 307 hours to 662 hours as compared with 245 hours to 269 hours for the organic EL devices of Comparative Examples 1 and 2.

As is clear from the above results, the arylamine compound having the specific structure represented by the general formula (1) has a high hole mobility and an excellent electron blocking ability as compared with the conventional arylamine compounds of Comparative Examples 1 and 2. Therefore, it was found that the organic EL device used together with the light emitting layer of the present disclosure could realize an organic EL device having high luminous efficiency and a long lifetime as compared with the conventional organic EL device.

Although the present invention has been described in detail with reference to specific examples, it is apparent to those skilled in the art that it is possible to add various alterations and modifications without departing from the spirit and the scope of the present invention.

The present application is based on Japanese Patent Application (No. 2020-8577) filed on Jan. 22, 2020, the entirety of which is incorporated by reference. In addition, all references cited here are incorporated by reference in their entirety.

INDUSTRIAL APPLICABILITY

According to the organic EL device using the arylamine compound having a specific structure according to the present invention, the luminous efficiency can be increased and the durability of the organic EL device can be improved. For example, the organic EL device according to the present invention can be deployed in a home electric appliance or lighting application.

REFERENCE SIGNS LIST

1 Glass substrate
2 Transparent anode
3 Hole injection layer
4 First hole transport layer
5 Second hole transport layer
6 Light emitting layer
7 Electron transport layer
8 Electron injection layer

9 Cathode

10 Capping layer

The invention claimed is:

1. An organic electroluminescent device, comprising:

an anode and a cathode; and at least a first hole transport layer, a second hole transport layer, a blue light emitting layer, and an electron transport layer in this order from an anode side between the anode and the cathode, wherein at least one layer of the layers disposed between the first hole transport layer and the electron transport layer comprises an arylamine compound represented by the following general formula (1):

(1)

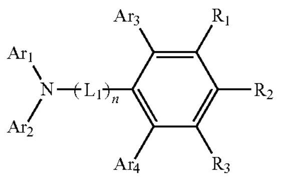

in formula, $Ar_1$, $Ar_2$, $Ar_3$, and $Ar_4$ may be the same as or different from each other, and each represent a substituted or unsubstituted aromatic hydrocarbon group, a substituted or unsubstituted aromatic heterocyclic group, or a substituted or unsubstituted condensed polycyclic aromatic group, $L_1$ represents a divalent group of a substituted or unsubstituted aromatic hydrocarbon, a divalent group of a substituted or unsubstituted aromatic heterocycle, or a divalent group of a substituted or unsubstituted condensed polycyclic aromatic, $R_1$, $R_2$, and $R_3$ may be the same as or different from each other, and each represent a hydrogen atom, a deuterium atom, a fluorine atom, a chlorine atom, a cyano group, a nitro group, a linear or branched alkyl group having a carbon number of 1 to 6 which may have a substituent, a cycloalkyl group having a carbon number of 5 to 10 which may have a substituent, a linear or branched alkenyl group having a carbon number of 2 to 6 which may have a substituent, a linear or branched alkyloxy group having a carbon number of 1 to 6 which may have a substituent, a cycloalkyloxy group having a carbon number of 5 to 10 which may have a substituent, a substituted or unsubstituted aromatic hydrocarbon group, a substituted or unsubstituted aromatic heterocyclic group, a substituted or unsubstituted condensed polycyclic aromatic group, or a substituted or unsubstituted aryloxy group, and n represents an integer of 1 to 3, the blue light emitting layer comprises a blue light emitting dopant, and the blue light emitting dopant is a compound represented by the following general formula (2) or (3):

(2)

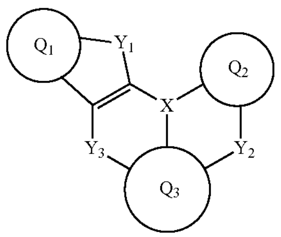

-continued (3)

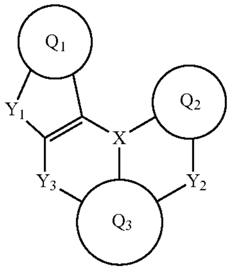

in formulae (2) and (3), $Q_1$ to $Q_3$ may be the same as or different from each other, $Q_1$ and $Q_3$ each represents a substituted or unsubstituted aromatic hydrocarbon or a substituted or unsubstituted aromatic heterocycle and $Q_2$ represents a substituted or unsubstituted aromatic hydrocarbon, X represents B, P, P=O, or P=S, $Y_1$ to $Y_3$ may be the same as or different from each other, and are any one selected from N—$R_4$, C—$R_5R_6$, O, S, Se, and Si—$R_7R_8$, $R_4$ to $R_8$ may be the same as or different from each other, and each represents a hydrogen atom, a deuterium atom, a fluorine atom, a chlorine atom, a cyano group, a nitro group, a linear or branched alkyl group having a carbon number of 1 to 6 which may have a substituent, a cycloalkyl group having a carbon number of 5 to 10 which may have a substituent, a linear or branched alkenyl group having a carbon number of 2 to 6 which may have a substituent, a linear or branched alkyloxy group having a carbon number of 1 to 6 which may have a substituent, a cycloalkyloxy group having a carbon number of 5 to 10 which may have a substituent, a substituted or unsubstituted aromatic hydrocarbon group, or a substituted or unsubstituted aryloxy group, $R_5$ and $R_6$, or $R_7$ and $R_8$ may be bonded to each other via a single bond, a substituted or unsubstituted methylene group, an oxygen atom, or a sulfur atom to form a ring, and when $Y_1$ and $Y_3$ are N—$R_4$, C—$R_5R_6$, or Si—$R_7R_8$, $R_4$ to $R_8$ may be bonded to adjacent $Q_1$ to $Q_3$ via a linking group of a substituted or unsubstituted methylene group, an oxygen atom, a sulfur atom, or a monosubstituted amino group to form a ring.

2. The organic electroluminescent device according to claim 1, wherein at least one of the layers disposed between the first hole transport layer and the blue light emitting layer comprises the arylamine compound represented by the foregoing general formula (1).

3. The organic electroluminescent device according to claim 1, wherein a layer adjacent to the blue light emitting layer among the layers disposed closer to the anode side than the blue light emitting layer comprises the arylamine compound represented by the foregoing general formula (1).

4. The organic electroluminescent device according to claim 1, wherein the second hole transport layer comprises the arylamine compound represented by the foregoing general formula (1).

5. The organic electroluminescence device according to claim 1, wherein $R_1$ and $R_3$ in the foregoing general formula (1) may be the same as or different from each other and are a hydrogen atom or a deuterium atom.

6. The organic electroluminescence device according to claim 1, wherein n in the foregoing general formula (1) is 1 or 2.

7. The organic electroluminescence device according to claim 1, wherein $L_1$ in the foregoing general formula (1) is a substituted or unsubstituted phenylene group.

8. The organic electroluminescent device according to claim 1, wherein the blue light emitting layer comprises an anthracene derivative having an anthracene skeleton.

* * * * *